US012571093B2

(12) United States Patent
Illiberi et al.

(10) Patent No.: US 12,571,093 B2
(45) **Date of Patent: *Mar. 10, 2026**

(54) SELECTIVE DEPOSITION OF SILICON OXIDE ON METAL SURFACES

(71) Applicant: ASM IP HOLDING B.V., Almere (NL)

(72) Inventors: Andrea Illiberi, Leuven (BE); Giuseppe Alessio Verni, Antwerp (BE); Shaoren Deng, Ghent (BE); Daniele Chiappe, Espoo (FI); Eva Tois, Helsinki (FI); Marko Tuominen, Helsinki (FI); Michael Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,095

(22) Filed: Apr. 19, 2023

(65) Prior Publication Data

US 2024/0076775 A1 Mar. 7, 2024

Related U.S. Application Data

(63) Continuation of application No. 17/216,249, filed on Mar. 29, 2021, now Pat. No. 11,643,720.
(Continued)

(51) Int. Cl.
*C23C 16/40* (2006.01)
*C23C 16/02* (2006.01)
(Continued)

(52) U.S. Cl.
CPC ........ *C23C 16/401* (2013.01); *C23C 16/0281* (2013.01); *C23C 16/04* (2013.01);
(Continued)

(58) Field of Classification Search
CPC ........................ C23C 16/401; C23C 16/45534
See application file for complete search history.

(56) References Cited

U.S. PATENT DOCUMENTS 4,804,640 A 2/1989 Kaganowicz
4,863,879 A 9/1989 Kwok
(Continued)

FOREIGN PATENT DOCUMENTS

CN 1650044 A 8/2005
CN 107210196 A 9/2017
(Continued)

OTHER PUBLICATIONS

Aaltonen et al., "Atomic Layer Deposition of Iridium Thin Films", Journal of The Electrochemical Society, 151 (8) G489-G492 (2004).
(Continued)

*Primary Examiner* — Jose I Hernandez-Kenney
(74) *Attorney, Agent, or Firm* — Banner & Witcoff, Ltd.

(57) ABSTRACT

Methods for selective deposition of silicon oxide films on metal or metallic surfaces relative to dielectric surfaces are provided. A dielectric surface of a substrate may be selectively passivated relative to a metal or metallic surface, such as by exposing the substrate to a silylating agent. Silicon oxide is then selectively deposited on the metal or metallic surface relative to the passivated oxide surface by contacting the metal surface with a metal catalyst and a silicon precursor comprising a silanol.

19 Claims, 3 Drawing Sheets

Related U.S. Application Data

(60) Provisional application No. 63/002,135, filed on Mar. 30, 2020.

(51) Int. Cl.

| | |
|---|---|
| ***C23C 16/04*** | (2006.01) |
| ***C23C 16/455*** | (2006.01) |
| ***H01L 21/02*** | (2006.01) |
| ***H01L 21/32*** | (2006.01) |
| *B01J 31/14* | (2006.01) |

(52) U.S. Cl.
CPC .. *C23C 16/45523* (2013.01); *C23C 16/45553* (2013.01); *H01L 21/02214* (2013.01); *H01L 21/0228* (2013.01); *H01L 21/32* (2013.01); *B01J 31/143* (2013.01)

(56) References Cited

U.S. PATENT DOCUMENTS

| | | | |
|---|---|---|---|
| 4,948,755 | A | 8/1990 | Mo |
| 5,288,697 | A | 2/1994 | Schrepp et al. |
| 5,447,887 | A | 9/1995 | Filipiak et al. |
| 5,604,153 | A | 2/1997 | Tsubouchi et al. |
| 5,633,036 | A | 5/1997 | Seebauer et al. |
| 5,869,135 | A | 2/1999 | Vaeth et al. |
| 5,925,494 | A | 7/1999 | Horn |
| 6,046,108 | A | 4/2000 | Liu et al. |
| 6,416,577 | B1 | 7/2002 | Suntoloa et al. |
| 6,426,015 | B1 | 7/2002 | Xia et al. |
| 6,455,414 | B1 | 9/2002 | Hillman et al. |
| 6,482,740 | B2 | 11/2002 | Soininen et al. |
| 6,586,330 | B1 | 7/2003 | Ludviksson et al. |
| 6,679,951 | B2 | 1/2004 | Soininen et al. |
| 6,759,325 | B2 | 7/2004 | Raaijmakers et al. |
| 6,811,448 | B1 | 11/2004 | Paton |
| 6,844,258 | B1 | 1/2005 | Fair et al. |
| 6,852,635 | B2 | 2/2005 | Satta et al. |
| 6,858,533 | B2 | 2/2005 | Chu et al. |
| 6,878,628 | B2 | 4/2005 | Sophie et al. |
| 6,887,795 | B2 | 5/2005 | Soininen et al. |
| 6,921,712 | B2 | 7/2005 | Soininen et al. |
| 6,958,174 | B1 | 10/2005 | Klaus et al. |
| 7,041,609 | B2 | 5/2006 | Vaartstra |
| 7,067,407 | B2 | 6/2006 | Kostamo et al. |
| 7,084,060 | B1 | 8/2006 | Furukawa et al. |
| 7,118,779 | B2 | 10/2006 | Verghese et al. |
| 7,220,669 | B2 | 5/2007 | Hujanen et al. |
| 7,241,677 | B2 | 7/2007 | Soininen et al. |
| 7,323,411 | B1 | 1/2008 | Blosse |
| 7,405,143 | B2 | 7/2008 | Leinikka et al. |
| 7,425,350 | B2 | 9/2008 | Todd |
| 7,476,618 | B2 | 1/2009 | Kilpela et al. |
| 7,494,927 | B2 | 2/2009 | Kostamo et al. |
| 7,595,271 | B2 | 9/2009 | White |
| 7,611,751 | B2 | 11/2009 | Elers |
| 7,695,567 | B2 | 4/2010 | Fu |
| 7,754,621 | B2 | 7/2010 | Putkonen |
| 7,790,631 | B2 | 9/2010 | Sharma et al. |
| 7,799,135 | B2 | 9/2010 | Verghese et al. |
| 7,910,177 | B2 | 3/2011 | Li |
| 7,914,847 | B2 | 3/2011 | Verghese et al. |
| 7,927,942 | B2 | 4/2011 | Raaijmakers |
| 7,951,637 | B2 | 5/2011 | Weidman et al. |
| 7,955,979 | B2 | 6/2011 | Kostamo et al. |
| 7,964,505 | B2 | 6/2011 | Khandelwal et al. |
| 8,173,554 | B2 | 5/2012 | Lee et al. |
| 8,293,597 | B2 | 10/2012 | Raaijmakers |
| 8,293,658 | B2 | 10/2012 | Shero et al. |
| 8,425,739 | B1 | 4/2013 | Wieting |
| 8,466,052 | B2 | 6/2013 | Baek et al. |
| 8,536,058 | B2 | 9/2013 | Kostamo et al. |
| 8,623,468 | B2 | 1/2014 | Lin et al. |
| 8,778,815 | B2 | 7/2014 | Yamaguchi et al. |
| 8,890,264 | B2 | 11/2014 | Dewey et al. |
| 8,956,971 | B2 | 2/2015 | Haukka et al. |
| 8,962,482 | B2 | 2/2015 | Albertson et al. |
| 8,980,418 | B2 | 3/2015 | Darling et al. |
| 8,993,404 | B2 | 3/2015 | Korbrinsky et al. |
| 9,067,958 | B2 | 6/2015 | Romero |
| 9,112,003 | B2 | 8/2015 | Haukka et al. |
| 9,129,897 | B2 | 9/2015 | Pore et al. |
| 9,136,110 | B2 | 9/2015 | Rathsack |
| 9,159,558 | B2 | 10/2015 | Cheng et al. |
| 9,236,292 | B2 | 1/2016 | Romero et al. |
| 9,257,303 | B2 | 2/2016 | Haukka et al. |
| 9,312,131 | B2 | 4/2016 | Bauer et al. |
| 9,349,687 | B1 | 5/2016 | Gates et al. |
| 9,353,139 | B2 | 5/2016 | Sundermeyer et al. |
| 9,455,138 | B1 | 9/2016 | Fukazawa et al. |
| 9,490,145 | B2 | 11/2016 | Niskanen et al. |
| 9,502,289 | B2 | 11/2016 | Haukka et al. |
| 9,552,979 | B2 | 1/2017 | Knaepen et al. |
| 9,679,808 | B2 | 6/2017 | Haukka et al. |
| 9,786,491 | B2 | 10/2017 | Suzuki et al. |
| 9,786,492 | B2 | 10/2017 | Suzuki et al. |
| 9,803,277 | B1 | 10/2017 | Longrie et al. |
| 9,805,974 | B1 | 10/2017 | Chen et al. |
| 9,816,180 | B2 | 11/2017 | Haukka et al. |
| 9,895,715 | B2 | 2/2018 | Haukka et al. |
| 9,911,595 | B1 | 3/2018 | Smith et al. |
| 10,014,212 | B2 | 7/2018 | Chen et al. |
| 10,041,166 | B2 | 8/2018 | Longrie et al. |
| 10,047,435 | B2 | 8/2018 | Haukka et al. |
| 10,049,924 | B2 | 8/2018 | Haukka et al. |
| 10,115,603 | B2 | 10/2018 | Niskanen et al. |
| 10,157,786 | B2 | 12/2018 | Haukka et al. |
| 10,186,420 | B2 | 1/2019 | Fukazawa |
| 10,204,782 | B2 | 2/2019 | Maes et al. |
| 10,343,186 | B2 | 7/2019 | Pore et al. |
| 10,373,820 | B2 | 8/2019 | Tois et al. |
| 10,428,421 | B2 | 10/2019 | Haukka et al. |
| 10,443,123 | B2 | 10/2019 | Haukka et al. |
| 10,453,701 | B2 | 10/2019 | Tois et al. |
| 10,480,064 | B2 | 11/2019 | Longrie et al. |
| 10,546,741 | B2 | 1/2020 | Muramaki et al. |
| 10,695,794 | B2 | 6/2020 | Pore et al. |
| 10,847,363 | B2 | 11/2020 | Tapily |
| 10,900,120 | B2 | 1/2021 | Sharma et al. |
| 11,643,720 | B2 * | 5/2023 | Illiberi .............. H01L 21/02164 427/579 |
| 2001/0019803 | A1 | 9/2001 | Mirkanimi |
| 2001/0021414 | A1 | 9/2001 | Morishima et al. |
| 2001/0025205 | A1 | 9/2001 | Chern et al. |
| 2002/0027261 | A1 | 3/2002 | Blesser et al. |
| 2002/0047144 | A1 | 4/2002 | Nguyen et al. |
| 2002/0068458 | A1 | 6/2002 | Chiang et al. |
| 2002/0090777 | A1 | 7/2002 | Forbes et al. |
| 2002/0107316 | A1 | 8/2002 | Bice et al. |
| 2003/0027431 | A1 | 2/2003 | Sneh et al. |
| 2003/0066487 | A1 | 4/2003 | Suzuki |
| 2003/0143839 | A1 | 7/2003 | Raaijmakers et al. |
| 2003/0176559 | A1 | 9/2003 | Bice et al. |
| 2003/0181035 | A1 | 9/2003 | Yoon et al. |
| 2003/0185997 | A1 | 10/2003 | Hsieh |
| 2003/0192090 | P1 | 10/2003 | Meilland |
| 2003/0193090 | A1 | 10/2003 | Otani et al. |
| 2004/0092073 | A1 | 5/2004 | Cabral |
| 2004/0129558 | A1 | 7/2004 | Liu et al. |
| 2004/0219746 | A1 | 11/2004 | Vaartstra et al. |
| 2004/0266185 | A1 | 12/2004 | Doke et al. |
| 2005/0012975 | A1 | 1/2005 | George et al. |
| 2005/0112282 | A1 * | 5/2005 | Gordon ............. C23C 16/45534 427/255.18 |
| 2005/0136604 | A1 | 6/2005 | Al-Bayati et al. |
| 2005/0160575 | A1 | 7/2005 | Gambino et al. |
| 2005/0223989 | A1 | 10/2005 | Lee et al. |
| 2006/0019493 | A1 | 1/2006 | Li |
| 2006/0047132 | A1 | 3/2006 | Shenai-Khatkhate et al. |
| 2006/0121271 | A1 | 6/2006 | Frey et al. |
| 2006/0121677 | A1 | 6/2006 | Parekh et al. |
| 2006/0121733 | A1 | 6/2006 | Kilpela et al. |
| 2006/0128150 | A1 | 6/2006 | Gandikota et al. |
| 2006/0141155 | A1 | 6/2006 | Gordon et al. |

(56) References Cited

U.S. PATENT DOCUMENTS

2006/0156979 A1 7/2006 Thakur et al.
2006/0176559 A1 8/2006 Takatoshi et al.
2006/0199399 A1 9/2006 Muscat
2006/0226409 A1 10/2006 Burr et al.
2006/0292845 A1 12/2006 Chiang et al.
2007/0014919 A1 1/2007 Hamalainen et al.
2007/0026654 A1 2/2007 Huotari et al.
2007/0036892 A1 2/2007 Haukka et al.
2007/0063317 A1 3/2007 Kim et al.
2007/0098894 A1 5/2007 Verghese et al.
2007/0099422 A1 5/2007 Wijekoon et al.
2007/0232082 A1 10/2007 Balseanu et al.
2007/0241390 A1 10/2007 Tanaka et al.
2007/0251444 A1 11/2007 Gros-Jean et al.
2007/0292604 A1 12/2007 Dordi et al.
2008/0032064 A1* 2/2008 Gordon ................. C23C 16/402 427/255.4
2008/0066680 A1 3/2008 Sherman
2008/0072819 A1 3/2008 Rahtu
2008/0124932 A1 5/2008 Tateishi et al.
2008/0179741 A1 7/2008 Streck et al.
2008/0241575 A1 10/2008 Lavoie et al.
2008/0282970 A1 11/2008 Heys et al.
2009/0035949 A1 2/2009 Niinisto et al.
2009/0071505 A1 3/2009 Miya et al.
2009/0081385 A1 3/2009 Heys et al.
2009/0203222 A1 8/2009 Dussarrat et al.
2009/0269507 A1 10/2009 Yu et al.
2009/0274887 A1 11/2009 Millward et al.
2009/0275163 A1 11/2009 Lacey et al.
2009/0311879 A1 12/2009 Blasco et al.
2010/0015756 A1 1/2010 Weidman et al.
2010/0102417 A1 4/2010 Ganguli et al.
2010/0147396 A1 6/2010 Yamagishi et al.
2010/0178468 A1 7/2010 Jiang et al.
2010/0248473 A1 9/2010 Ishizaka et al.
2010/0270626 A1 10/2010 Raisanen
2010/0297474 A1 11/2010 Dameron
2010/0314765 A1 12/2010 Liang et al.
2011/0039420 A1 2/2011 Nakao
2011/0053800 A1 3/2011 Jung et al.
2011/0120542 A1 5/2011 Levy
2011/0124192 A1 5/2011 Ganguli et al.
2011/0146568 A1 6/2011 Haukka et al.
2011/0146703 A1 6/2011 Chen et al.
2011/0198756 A1 8/2011 Thenappan et al.
2011/0221061 A1 9/2011 Prakash et al.
2011/0244680 A1 10/2011 Tahnoe et al.
2011/0311726 A1 12/2011 Liu et al.
2012/0032311 A1 2/2012 Gates
2012/0046421 A1 2/2012 Darling et al.
2012/0052681 A1 3/2012 Marsh
2012/0088369 A1 4/2012 Weidman et al.
2012/0091541 A1 4/2012 Suchomel et al.
2012/0189868 A1 7/2012 Borovik et al.
2012/0219824 A1 8/2012 Prolier et al.
2012/0241411 A1 9/2012 Darling et al.
2012/0264291 A1 10/2012 Ganguli et al.
2012/0269970 A1 10/2012 Ido et al.
2013/0005133 A1 1/2013 Lee et al.
2013/0078793 A1 3/2013 Sun et al.
2013/0084700 A1 4/2013 Swerts et al.
2013/0089983 A1 4/2013 Sugita et al.
2013/0095664 A1 4/2013 Matero et al.
2013/0115763 A1 5/2013 Takamure et al.
2013/0115768 A1 5/2013 Pore et al.
2013/0126815 A1 5/2013 Kim et al.
2013/0143401 A1 6/2013 Yu et al.
2013/0146881 A1 6/2013 Yamazaki et al.
2013/0157409 A1 6/2013 Vaidya et al.
2013/0189790 A1 7/2013 Li et al.
2013/0189837 A1 7/2013 Haukka et al.
2013/0196502 A1 8/2013 Haukka et al.
2013/0203267 A1 8/2013 Pomarede et al.
2013/0280919 A1 10/2013 Yuasa et al.
2013/0284094 A1 10/2013 Pavol et al.
2013/0309457 A1 11/2013 Rathsack et al.
2013/0316080 A1 11/2013 Yamaguchi et al.
2013/0319290 A1 12/2013 Xiao et al.
2013/0323930 A1 12/2013 Chattopadhyay et al.
2013/0330936 A1 12/2013 Lachaud et al.
2014/0001572 A1 1/2014 Bohr et al.
2014/0024200 A1 1/2014 Kato et al.
2014/0091308 A1 4/2014 Dasgupta et al.
2014/0120738 A1 5/2014 Jung et al.
2014/0152383 A1 6/2014 Nikonov et al.
2014/0190409 A1 7/2014 Matsumoto et al.
2014/0193598 A1 7/2014 Traser et al.
2014/0205766 A1 7/2014 Lyon et al.
2014/0209022 A1 7/2014 Inoue et al.
2014/0227461 A1 8/2014 Darwish et al.
2014/0252487 A1 9/2014 Stephens et al.
2014/0272194 A1 9/2014 Xiao et al.
2014/0273290 A1 9/2014 Somervell
2014/0273477 A1 9/2014 Niskanen et al.
2014/0273514 A1 9/2014 Somervell et al.
2014/0273523 A1 9/2014 Rathsack
2014/0273527 A1 9/2014 Niskanen et al.
2015/0004317 A1 1/2015 Dussarrat et al.
2015/0004319 A1 1/2015 Mizue
2015/0004806 A1 1/2015 Ndiege et al.
2015/0011032 A1 1/2015 Kunimatsu et al.
2015/0011093 A1 1/2015 Singh et al.
2015/0037972 A1 2/2015 Danek et al.
2015/0064931 A1 3/2015 Kumagi et al.
2015/0083415 A1 3/2015 Monroe et al.
2015/0087158 A1 3/2015 Sugita et al.
2015/0093890 A1 4/2015 Blackwell et al.
2015/0097292 A1 4/2015 He et al.
2015/0118863 A1 4/2015 Rathod et al.
2015/0162214 A1 6/2015 Thompson et al.
2015/0170961 A1 6/2015 Romero et al.
2015/0179798 A1 6/2015 Clendenning et al.
2015/0217330 A1 8/2015 Haukka et al.
2015/0240121 A1 8/2015 Sugita et al.
2015/0275355 A1 10/2015 Mallikarjunan et al.
2015/0299848 A1 10/2015 Haukka et al.
2015/0371866 A1 12/2015 Chen et al.
2015/0372205 A1 12/2015 Kimura et al.
2015/0376211 A1 12/2015 Girard et al.
2016/0005731 A1 1/2016 Chen
2016/0075884 A1 3/2016 Chen
2016/0079524 A1 3/2016 Do et al.
2016/0086850 A1 3/2016 Romero et al.
2016/0152640 A1 6/2016 Kuchenbeiser et al.
2016/0172189 A1 6/2016 Tapily
2016/0186004 A1 6/2016 Hustad et al.
2016/0190060 A1 6/2016 Bristol et al.
2016/0222504 A1 8/2016 Haukka et al.
2016/0233084 A1 8/2016 Chen et al.
2016/0247695 A1 8/2016 Niskanen et al.
2016/0276208 A1 9/2016 Haukka et al.
2016/0284568 A1 9/2016 Morris et al.
2016/0293384 A1 10/2016 Yan et al.
2016/0293398 A1 10/2016 Danek et al.
2016/0315191 A1 10/2016 Tsai et al.
2016/0346838 A1 12/2016 Fujita et al.
2016/0365280 A1 12/2016 Brink et al.
2017/0037513 A1 2/2017 Haukka et al.
2017/0040164 A1 2/2017 Wang et al.
2017/0051405 A1 2/2017 Fukazawa et al.
2017/0058401 A1 3/2017 Blackwell et al.
2017/0069527 A1 3/2017 Haukka et al.
2017/0100742 A1 4/2017 Pore et al.
2017/0100743 A1 4/2017 Pore et al.
2017/0107413 A1 4/2017 Wang et al.
2017/0154806 A1 6/2017 Wang et al.
2017/0298503 A1 10/2017 Maes et al.
2017/0301542 A1 10/2017 Maes et al.
2017/0323776 A1 11/2017 Färm et al.
2017/0332179 A1 11/2017 Bright et al.
2017/0352533 A1 12/2017 Tois et al.
2017/0352550 A1 12/2017 Tois et al.
2017/0358482 A1 12/2017 Chen et al.

(56) References Cited

U.S. PATENT DOCUMENTS

| | | | |
|---|---|---|---|
| 2018/0010247 A1 | 1/2018 | Niskanen et al. | |
| 2018/0040708 A1 | 2/2018 | Narayanan et al. | |
| 2018/0073136 A1 | 3/2018 | Haukka et al. | |
| 2018/0080121 A1 | 3/2018 | Longrie et al. | |
| 2018/0096888 A1 | 4/2018 | Naik et al. | |
| 2018/0142348 A1 | 5/2018 | Yu et al. | |
| 2018/0151345 A1 | 5/2018 | Haukka et al. | |
| 2018/0151355 A1 | 5/2018 | Fukazawa | |
| 2018/0182618 A1 | 6/2018 | Blanquart et al. | |
| 2018/0211833 A1* | 7/2018 | Li | C23C 16/458 |
| 2018/0222933 A1 | 8/2018 | Romero | |
| 2018/0233350 A1 | 8/2018 | Tois et al. | |
| 2018/0243787 A1 | 8/2018 | Haukka et al. | |
| 2018/0350587 A1 | 12/2018 | Jia et al. | |
| 2019/0017170 A1 | 1/2019 | Sharma et al. | |
| 2019/0057858 A1 | 2/2019 | Hausmann et al. | |
| 2019/0074441 A1 | 3/2019 | Kikuchi et al. | |
| 2019/0100837 A1 | 4/2019 | Haukka et al. | |
| 2019/0155159 A1 | 5/2019 | Knaepen et al. | |
| 2019/0283077 A1 | 9/2019 | Pore et al. | |
| 2019/0333761 A1 | 10/2019 | Tois et al. | |
| 2019/0341245 A1 | 11/2019 | Tois et al. | |
| 2020/0051829 A1 | 2/2020 | Tois et al. | |
| 2020/0090924 A1 | 3/2020 | Wu et al. | |
| 2020/0105515 A1 | 4/2020 | Maes et al. | |
| 2020/0122191 A1 | 4/2020 | Haukka et al. | |
| 2020/0325573 A1 | 10/2020 | Illiberi et al. | |
| 2020/0395211 A1 | 12/2020 | Jia et al. | |

FOREIGN PATENT DOCUMENTS

| | | |
|---|---|---|
| CN | 111816547 | 10/2020 |
| EP | 0469456 | 2/1992 |
| EP | 0880168 | 11/1998 |
| EP | 1340269 | 2/2009 |
| EP | 3026055 | 6/2016 |
| JP | 2001-127068 | 5/2001 |
| JP | 2008-311603 | 12/2008 |
| JP | 2011-018742 | 1/2011 |
| JP | 2011-187583 | 9/2011 |
| JP | 2014-093331 | 5/2014 |
| KR | 10-2001-001072 | 2/2001 |
| KR | 10-2002-0010821 | 2/2002 |
| KR | 2003-0027392 | 4/2003 |
| KR | 10-2004-0056026 | 6/2004 |
| KR | 10-2005-0103811 | 11/2005 |
| KR | 10-0920033 | 10/2009 |
| KR | 10-2010-0093859 | 8/2010 |
| KR | 10-2015-0092022 A | 8/2015 |
| KR | 10-2020-0120872 | 10/2020 |
| KR | 10-2197048 | 12/2020 |
| TW | 2005-39321 | 12/2005 |
| TW | 2010-05827 | 2/2010 |
| TW | 2010-27766 | 7/2010 |
| TW | 2014-39365 | 10/2014 |
| TW | 201543570 A | 11/2015 |
| TW | 201836023 A | 10/2018 |
| TW | I652734 | 3/2019 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014/209390 | 12/2014 |
| WO | WO 2015/047345 | 4/2015 |
| WO | WO 2015/094305 | 6/2015 |
| WO | WO 2015/147843 | 10/2015 |
| WO | WO 2015/147858 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Atanasov et al., "Inherent substrate-dependent growth initation and selective-area atomic layer deposition of TiO2 using "water-free" metal-halide/metal alkoxide reactants", J. Vac. Sci. Technol. A 34(1), Jan./Feb. 2016, pp. 01A148-1-01A148-9.
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton et al., "Atomic Layer Deposition of MgO Using Bis(ethylcyclopentadienyl)magnesium and H2O". J. Phys. Chem. C, 2009, 113, 1939-1946.
Burton et al., "Rapid SiO2 Atomic Layer Deposition Using Tris(tert-pentoxy)silanol", Chem. Mater. 2008, 20, pp. 7031-7043.
Burton et al. "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Cai et al., "Selective Passivation of Pt Nanoparticles with Enhanced Sintering Resistance and Activity toward CO Oxidation via Atomic Layer Deposition", ACS Appl. Nano Mater. 2018, 1, 2, pp. 522-530.
Carlsson, J., "Precursor Design for Chemical Vapour Deposition", Acta Chemica Scandinavica, vol. 45, 1991, pp. 864-869.
Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., "Highly Stable Monolayer Resists for Atomic Layer Deposition on Germanium and Silicon", Chem. Matter, vol. 18, No. 16, pp. 3733-3741, 2006.
Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.
Choi et al., "Rapid vapor deposition SiO2 thin film deposited at a low temperature using tris(tert-pentoxy)silanol and trimethyl-aluminum", Materials Chemistry and Physics, 142 (2013), pp. 614-618.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farm et al. "Selective-Area Atomic Layer Deposition Using Poly( methyl methacrylate) Films as Mask Layers", J. Phys. Chem. C, 2008, 112, pp. 15791-15795. (Year: 2008).
Farr, "Synthesis and Characterization of Novel Polyimide Gas Separation Membrane Material Systems", Chapter 2; Virginia Tech Chemistry PhD Dissertation; URN# etd-080999-123034; Jul. 26, 1999.
File History of U.S. Appl. No. 13/702,992, filed Mar. 26, 2013.

(56) References Cited

OTHER PUBLICATIONS

File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 16/987,990, filed Aug. 7, 2020.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 17/135,001, filed Dec. 28, 2020.
File History of U.S. Appl. No. 16/399,328, filed Apr. 30, 2019.
File History of U.S. Appl. No. 17/113,383, filed Dec. 7, 2020.
File History of U.S. Appl. No. 15/971,601, filed May 4, 2018.
File History of U.S. Appl. No. 16/588,600, filed Sep. 30, 2019.
File History of U.S. Appl. No. 16/836,151, filed Mar. 31, 2020.
File History of U.S. Appl. No. 17/064,865, filed Oct. 7, 2020.
Formic Acid, Wikipedia via https://en.wikipedia.org/wiki/Formic_acid; pp. 1-5, no date available.
George, "Atomic layer deposition: An overview", Chem. Rev. 2010, 110 pp. 111-131, Feb. 12, 2009.
Ghosal et al., "Controlling Atomic Layer Deposition of TiO2 in Aerogels through Surface Functionalization", Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hausmann et al., "Rapid Vapor Deposition of Highly Conformal Silica Nanolaminates", Science, vol. 298, Oct. 11, 2002, pp. 402-406.
Hu et al. "Coating strategies for atomic layer deposition", Nanotechnol. Rev. 2017; 6(6): pp. 527-547.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
Jin et al., "Lanthanide metal-assisted synthesis of rhombic dodecahedral Mni (M=Ir and Pt) nanoframes toward efficient oxygen evolution catalysis", Nano Energy 42, 2017, pp. 17-25.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., "Area-Selective Atomic Layor Deposition Using Self-Assembled Monolayer and Scanning Probe Lithography", Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang et al., "Growth of Ge Nanofilms Using Electrochemical Atomic Layer Deposition, with a "Bait and Switch" Surface-Limited Reaction". Journal of American Chemical Society, 2011, 133, 8199-8024.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., "Selective deposition of CVD iron on silicon dioxide and tungsten", Microelectronic Engineering 83, pp. 2229-2233, 2006.
Mackus et al., "Influence of Oxygen Exposure on the Nucleation of Platinum Atomic Layer Deposition: Consequences for Film Growth", Nanopatterning, and Nanoparticle Synthesis, Chem. Matter, vol. 25, pp. 1905-1911, 2013.
Mackus et al., "Local deposition of high-purity Pt nanostructures by combining electron beam induced deposition and atomic layer deposition", Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25 μm trenches for the fabrication of scaled contacts and x-ray masks", J. Vac. Sci. Technol. B, vol. 8, No. 3, May/Jun. 1990, pp. 568-569.
Mameli et al., Area-Selective Atomic Layer Deposition of SiO2 Using Acetylacetone as a Chemoselective Inhibitor in an ABC-Type Cycle, ACS Nano, Aug. 29, 2017, 9303-9311, 11, 9, American Chemical Society.
Norrman, et al.; 6 Studies Of Spin-Coated Polymer Films; Annu. Rep. Prag. Chem.; Sect. C; 2005; 101; pp. 174-201.
Overhage et al., "Selective Atomic Layer Deposition (SALD) of Titanium Dioxide on Silicon and Copper Patterned Substrates", Journal of Undergraduate Research 4, Mar. 29, 2011 in 4 pages.
Parsons et al., "Area-Selective Deposition: Fundamentals, Applications, and Future Outlook", Chemistry of Materials, 2020, 32, 12, pp. 4920-4953.

(56) References Cited

OTHER PUBLICATIONS

Parulekar et al., "Atomic Layer Deposition of Zirconium Oxide on Copper Patterned Silicon Substrate", Journal of Undergraduate Research, vol. 7, pp. 15-17, 2014.
Parulekar et al., "Selective atomic layer deposition of zirconium oxide on copper patterned silicon substrate", pp. 1-6, 2013.
Prasittichai et al., "Area Selective Molecular Layer Deposition of Polyurea Film", Applied Materials & Interfaces, 2013, vol. 5, pp. 13391-13396.
Priimagi et al., "The Halogen Bond in the Design of Functional Supramolecular Materials: Recent Advances", Accounts of Chemical Research, 2013, vol. 46, No. 11, pp. 2686-2695.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, "Decomposition of formic acid", Chemnitz University of Technology, pp. 1-13, Aug. 31, 2011.
Schmeißer, "Reduction of Copper Oxide by Formic Acid an ab-initio study", Chemnitz University of Technology, pp. 1-42, Sep. 2011.
Schuiskly et al., "Atomic Layer Deposition of Thin Films Using O2 as Oxygen Source", Langmuir, vol. 17, No. 18, 2001, pp. 5508-5512.
Selvaraj et al., "Selective atomic layer deposition of zirconia on copper patterned silicon substrates using ethanol as oxygen source as well as copper reductant", Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Singh et al., "Area-Selective Atomic Layer Deposition of Metal Oxides on Noble Metals through Catalytic Oxygen Activation", Chem. Mater. 2018, 30, pp. 663-670.
Soethoudt et al.,"Impact of SiO2 surface composition on trimethylsilane passivation for area-selective deposition", J. Mater. Chem. C, 2019, 7, pp. 11911-11918.
Sundberg, et al.; Organic And Inorganic-Organic Thin Film Structures By Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov et al., "Thermal Cyclodehydration of Polyamic Acid Initiated by UV-Irradiation", Iranian Polymer Journal; vol. 5, No. 1; pp. 16-22; 1996; Iran.
Tomczak, Y., In Situ Reaction Mechanism Studies on Atomic Layer Deposition of AlxSiyOz from |Trimethylaluminium, Hexakis(ethylamino)disilane, and Water, Chem. Mater., Oct. 12, 2012, 3859-3867, 24, American Chemical Society.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Vallat et al., "Selective deposition of Ta205 by adding plasma etching super-cycles in plasma enhanced atomic layer deposition steps", Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Wang et al., "Low-temperature plasma-enhanced atomic layer deposition of tin oxide electron selectivelayers for highly efficient planar perovskite solar cells", Journal of Materials Chemistry A, 2016, 4, pp. 12080-12087.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Zhou, et al., Fabrication of Organic Interfacial Layers By Molecular Layer Deposition: Present StatusAnd Future Opportunities; Journal of Vacuum Science & Technology; A 31 (4), 040801-1 to 040801-18; 2013.

* cited by examiner

SELECTIVE DEPOSITION OF SILICON OXIDE ON METAL SURFACES

REFERENCE TO RELATED APPLICATION

The present application is a continuation of U.S. application Ser. No. 17/216,249, filed Mar. 29, 2021, which claims priority to U.S. Provisional Application No. 63/002,135, filed on Mar. 30, 2020, each of which is incorporated by reference herein in its entirety.

BACKGROUND

Field

The present disclosure relates generally to selective deposition of silicon oxide on a metal or metallic surface of a substrate relative to a dielectric surface of the substrate.

Description of the Related Art

The shrinking device dimensions in semiconductor manufacturing call for new innovative processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

Patterning could be simplified by selective deposition, which has received increasing interest among semiconductor manufacturers. Selective deposition would be highly beneficial in various ways. Significantly, it could allow a decrease in lithography steps, reducing the cost of processing. Selective deposition could also enable enhanced scaling in narrow structures.

Thin films comprising silicon dioxide are used in many different applications in microelectronic devices, for example, as dielectric materials. Silicon dioxide is one of the most commonly used dielectric materials in silicon microelectronic devices.

SUMMARY

In some aspects, methods for selective deposition of silicon oxide films on metal or metallic surfaces relative to dielectric surfaces are provided. In some embodiments, the methods of selectively depositing silicon oxide on a metal surface of a substrate relative to a dielectric surface of the substrate comprise, in order: contacting the substrate with a passivation agent; contacting the metal surface with a metal catalyst; and contacting the metal surface with a silicon reactant comprising a silanol. In some embodiments, the metal surface comprises one or more of Al, Cu, Co, Ni, W, Nb, Fe, and Mo. In some embodiments, the dielectric surface comprises a silicon oxide. In some embodiments, contacting the substrate with the passivation agent results in selectively passivating the dielectric surface relative to the metal surface. In some embodiments, the passivation agent is a silylating agent. In some embodiments, the silylating agent comprises an alkylaminosilane. In some embodiments, the alkylaminosilane has a formula $(R^{I})_3Si(NR^{II}R^{III})$, wherein $R^{I}$ is a linear or branched $C_1$-$C_5$ alkyl group or a linear or branched $C_1$-$C_4$ alkyl group, $R^{II}$ is a linear or branched $C_1$-$C_5$ alkyl group, a linear or branched $C_1$-$C_4$ alkyl group, or hydrogen, and $R^{III}$ is a linear or branched $C_1$-$C_5$ alkyl group or a linear or branched $C_1$-$C_4$ alkyl group. In some embodiments, the silylating agent comprises allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

In some embodiments, the metal catalyst comprises trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA). In some embodiments, the metal catalyst is a metal compound comprising Zn, Mg, Mn, La, Hf, Al, Zr, Ti, Sn, or Ga. In some embodiments, the metal catalyst is a metal halide, organometallic compound or metalorganic compound.

In some embodiments, the silicon reactant comprises tris(tert-butoxy)silanol (TBS), tris(isopropoxy)silanol (TIS), or tris(tert-pentoxy)silanol (TPS).

In some embodiments, a passivation blocking layer is formed on the metal surface prior to contacting the substrate with the passivation agent. In some embodiments, the passivation blocking layer comprises a polymer or a self-assembled monolayer (SAM).

In some embodiments, the selectivity of deposition of silicon oxide on the catalyzed metal surface relative to the passivated dielectric surface is greater than about 50%.

In some embodiments, selectively depositing silicon oxide on a metal surface of a substrate relative to a dielectric surface of the substrate comprises a deposition super-cycle comprising: contacting the substrate with a silylating agent, and conducting one or more silicon oxide deposition sub-cycles comprising alternately and sequentially contacting the substrate with a metal catalyst and a silanol. In some embodiments, the silylating agent is N-(trimethylsilyl)dimethylamine. In some embodiments, the metal catalyst comprises trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA).

In some embodiments, the metal catalyst is a metal compound comprising Zn, Mg, Mn, La, Hf, Al, Zr, Ti, Sn, or Ga. In some embodiments, the metal catalyst is a metal halide, organometallic compound, or metalorganic compound. In some embodiments, the silane is tris(tert-pentoxy) silanol. In some embodiments, the silicon oxide deposition sub-cycle is repeated two or more times in the deposition super-cycle. In some embodiments, the substrate is contacted with the silanol two or more times in at least one silicon oxide deposition sub-cycle. In some embodiments, the deposition super-cycle is repeated two or more times.

In some embodiments, methods of selectively depositing silicon oxide on a metal surface of a substrate relative to a dielectric surface of the substrate comprise alternately and sequentially contacting the substrate with a silylating agent comprising allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA); trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA); and tris(tert-pentoxy)silanol.

DETAILED DESCRIPTION

Figure 1:
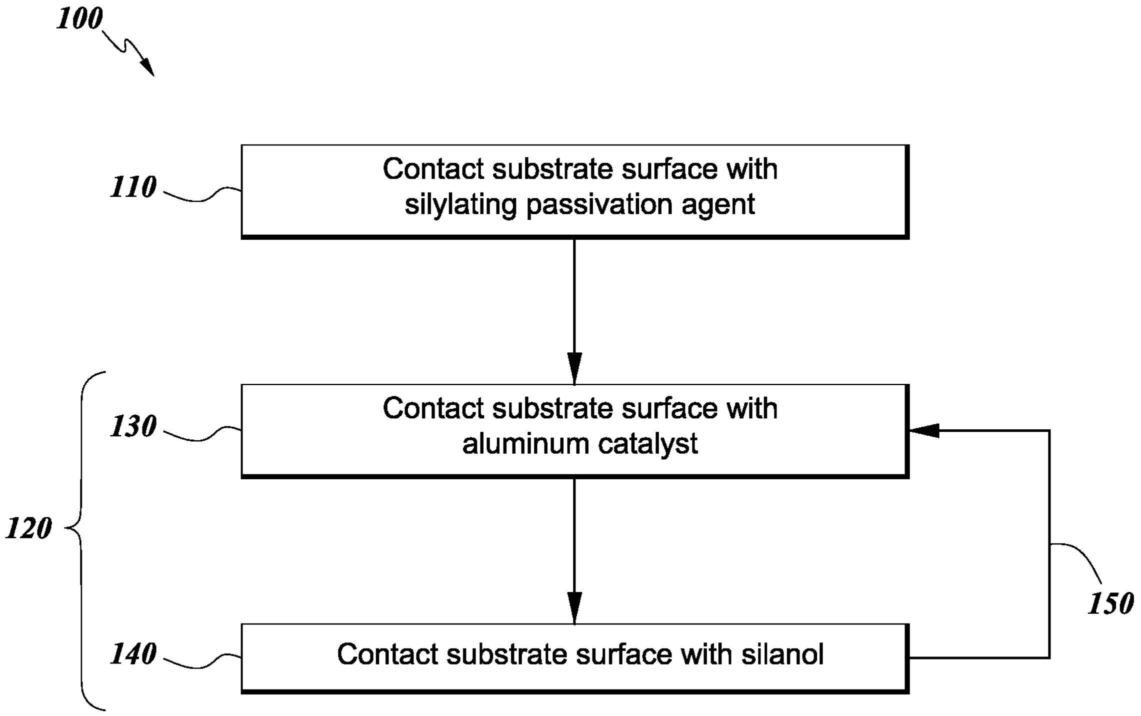
FIG. 1 is a flow chart illustrating a deposition process for selectively depositing silicon oxide on a metal surface relative to a dielectric surface.

The silicon oxide films, such as silicon dioxide films, for example $SiO_2$ films, formed by the methods described herein can be used in a variety of contexts. Silicon oxide films, such as silicon dioxide films, for example $SiO_2$ films, are used, for example, in a wide variety of semiconductor devices, including CMOS, DRAM, flash, and magnetic head applications. Silicon oxide, such as silicon dioxide, for example $SiO_2$, is also commonly used as a gate dielectric for CMOS, as an electrical isolation layer, and gap filling layer. Silicon oxide films, such as silicon dioxide films, for example $SiO_2$ films, can be deposited by silanol exposure to surfaces comprising an appropriate catalyst. The catalyst prepares the surface for reaction with a silanol that leads to catalytic silicon oxide growth on the substrate surface.

In some embodiments, silicon oxide is selectively deposited over a first metal (or metallic) surface relative to a second dielectric surface, such as an oxide surface, through the use of a passivation agent in combination with a catalyst. In some embodiments, the dielectric surface may be selectively passivated relative to the metal surface, for example by silylation. Subsequently, a catalyst is selectively deposited on the metal surface relative to the dielectric surface. The catalyst may be, for example, a metal catalyst as described in more detail below. A silicon oxide layer is then selectively deposited on the metal surface relative to the passivated dielectric surface by contacting the substrate with a silicon reactant such as a silanol. In some embodiments, silicon oxide is deposited after passivation of the dielectric surface and a catalyst is not deposited on the metal surface. The silicon oxide layer may be deposited by a cyclical vapor deposition process in which the substrate is alternately contacted with the catalyst and the silanol until a silicon oxide film of a desired thickness has been selectively deposited. In some embodiments the passivation step may be omitted.

In some embodiments a dielectric surface, such as an oxide surface, on a substrate is silylated with a silylating agent such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA), a metal catalyst as described herein is selectively deposited on a metal surface of the same substrate, and silicon oxide is subsequently selectively deposited on the metal surface of the substrate relative to the passivated dielectric surface. For example, a silicon oxide layer may be selectively deposited on a metal surface relative to an adjacent dielectric surface, such as a metal oxide surface, a silicon oxide surface or a low k surface, by, for example, using allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA) as the passivation agent, trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA) as an aluminum catalyst, and a silanol such as tris(tert-pentoxy)silanol as the silicon reactant.

In some embodiments a metal or metallic surface of a substrate comprises an elemental metal or metal alloy, while a second, different surface of the substrate comprises a dielectric material, such as an oxide. In some embodiments the dielectric surface and metal surface are adjacent to each other. Examples of possible dielectric materials include silicon oxide-based materials, including grown or deposited silicon dioxide, doped and/or porous oxides, native oxide on silicon, etc. In some embodiments the dielectric material comprises a metal oxide. In some embodiments the dielectric material comprises a low k material.

The surface of the dielectric material may be selectively passivated relative to the metal or metallic surface, such as by selective silylation. In some embodiments the dielectric surface is contacted with a vapor phase passivation agent, such as vapor phase allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA). The substrate may be contacted with a sufficient quantity of the passivation agent and for a sufficient period of time that the dielectric surface is selectively passivated with silicon species. In some embodiments both surfaces are contacted with the vapor phase passivation agent and the dielectric surface is selectively passivated relative to the metal or metallic surface. In some embodiments the dielectric surface is not passivated with a self-assembled monolayer (SAM).

A catalyst is selectively formed on the metal surface relative to the dielectric surface, such as by contacting the substrate with a metal catalyst compound. In some embodiments the catalyst is a metal catalyst. Both the metal surface and the dielectric surface are contacted with the metal catalyst compound in some embodiments. A metal surface comprising catalyst species may be referred to as a "catalyzed metal surface" herein. In some embodiments the substrate is contacted with a metal catalyst as described below. The catalyst may be, for example, a metal compound comprising Zn, Mg, Mn, La, Hf, Al, Zr, Ti, Sn, or Ga. In some embodiments the catalyst is a metal halide, organometallic or metalorganic compound. In some embodiments the catalyst may be a metal oxide. In some embodiments the catalyst is a compound comprising boron. In some embodiments the metal catalyst is an aluminum catalyst comprising trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA). In some embodiments the catalyst is a zirconium compound, such as $Zr\text{-}DO_4$. In some embodiments the catalyst is tetrakis(ethylmethylamino)zirconium (TEMAZ). In some embodiments the catalyst is $ZrCl_4$. In some embodiments the catalyst is a lanthanum compound, such as tris(isopropyl-cyclopentadienyl)lanthanum ($LA(iPrCp)_3$). In some embodiments the catalyst is a titanium compound, such as titanium isopropoxide (TTIP) or $TiCl_4$. In some embodiments the catalyst is a gallium compound, such as trimethylgallium (TMG). In some embodiments the catalyst is a hafnium compound, such as $HfCl_4$ or $Hf(NO_3)_4$.

In some embodiments the catalyst may preferentially deposit on the metal surface relative to the dielectric surface. In some embodiments the catalyst preferentially deposits on the metal surface relative to a passivated dielectric surface. In some embodiments the passivation agent on the dielectric surface inhibits or prevents deposition of aluminum catalyst on the dielectric surface. In some embodiments a single exposure to the passivation agent may prevent deposition of catalyst on the dielectric surface for 1, 2, 5, 10, 20, 30, 40 or 50 or more cycles in which the substrate is contacted with the catalyst. In some embodiments the dielectric surface is not passivated and the catalyst selectively deposits on the metal surface in the absence of a passivating material on the dielectric surface. In some embodiments a catalyst is not utilized, for example where the metal of the metal or metallic surface may itself catalyze the silicon oxide deposition.

After deposition of the catalyst on the metal or metallic surface, a silicon oxide layer is selectively deposited on the metal or metallic surface relative to the passivated dielectric surface. For example, the substrate may be exposed to a silicon precursor, such as a silanol. In some embodiments the substrate is exposed to the silicon precursor alone, while in some embodiments the substrate is exposed to the silicon precursor and an oxygen precursor, such as $H_2O$. The silicon precursor may react with the surface comprising the aluminum catalyst to form silicon oxide. For example, the substrate may be contacted with a silicon reactant comprising a silanol such that the silanol decomposes at the catalyst atoms on the metal or metallic surface, resulting in the selective growth of silicon oxide on the metal or metallic surface relative to the dielectric surface.

In some embodiments the substrate is alternately and sequentially contacted with the passivation agent, the catalyst and the silanol reactant in one or more deposition super-cycles. This deposition super-cycle may be repeated multiple times to selectively deposit a silicon oxide film of a desired thickness on the metal surface relative to the dielectric surface. With reference to FIG. 1, in some embodiments in a complete deposition super-cycle 100 the substrate is initially contacted with the passivation agent 110, such as a silylating agent. Excess passivation agent may be removed from the substrate surface. A silicon oxide deposition sub-cycle 120 is carried out in which the substrate is contacted with the catalyst 130 and the silicon precursor, such as a silanol 140. As mentioned above, in some embodiments the substrate is contacted with an oxygen reactant such as $H_2O$ in addition to the silicon reactant. Excess catalyst and silanol may be removed from the substrate surface after each contacting step 130 and 140. The sub-cycle may be repeated 150 multiple times in a single deposition super-cycle 100. In some embodiments one, two, three or more silicon oxide deposition sub-cycles in which the substrate is alternately and sequentially contacted with the catalyst 130 and the silanol reactant 140 are carried out in each deposition super-cycle 100. That is, for each time that the substrate is contacted with the passivation agent 110, multiple silicon oxide deposition sub-cycles 120 may be carried out. In some embodiments the silicon oxide deposition sub-cycle 120 is repeated up to fifty times prior to commencing another deposition super-cycle 100 by contacting the substrate with the passivation agent. In some embodiments after the deposition sub-cycles and prior to contacting the substrate with the passivation agent 110, the passivation layer is removed, such as by plasma etching, for example by contacting the substrate with $H_2$ plasma. In this way the passivation layer may be renewed one or more times during the deposition process. In some embodiments the passivation layer is not removed in every deposition super-cycle 100 but is only removed in one or more deposition super-cycles, such as in the last deposition super-cycle. The deposition super-cycle 100 may be repeated until a silicon oxide film of a desired thickness has been selectively formed on the metal surface. In some embodiments the passivation agent is provided only once in the deposition process.

In some embodiments the metal or metallic surface on which the metal oxide is selectively deposited is at least partially adjacent to the dielectric surface that is selectively passivated. For example, at least one portion of a metal or metallic surface may be adjacent to a dielectric surface such as an oxide surface.

In some embodiments, prior to forming the passivation layer on the dielectric surface, such as an oxide surface, the metal or metallic surface can be provided with a passivation blocking layer, such as a self-assembled monolayer (SAM). The passivation blocking layer may facilitate selectivity for the passivation, such as silylation, of the dielectric surface, and the passivation blocking layer can be removed thereafter to permit selective deposition of the metal catalyst and the silicon oxide on the metal or metallic surface relative to the silylated dielectric surface.

The passivation layer (for example silylation) on the dielectric surface may be removed from the dielectric surface, such as from an oxide surface, following the selective deposition of the silicon oxide layer over the metal or metallic surface. Conditions may be chosen to avoid damage to surrounding materials on the substrate. In some embodiments the passivation layer (for example silylation) on the dielectric surface may be removed and renewed at one or more intervals during the deposition of the silicon oxide layer. For example, the passivation layer may be removed, such as by exposure to $H_2$ plasma, at one or more intervals during the deposition process, followed by re-exposure to the silylating agent before proceeding with further silicon oxide deposition. In some embodiments the passivation layer is removed and renewed in each cycle.

Examples of suitable reactors that may be used in the selective deposition processes described herein include commercially available atomic layer deposition (ALD) equipment. In addition to ALD reactors, many other kinds of reactors capable of growth of organic passivation layers, including chemical vapor deposition (CVD) reactors, vapor deposition polymerization (VDP) reactors, and molecular layer deposition (MLD) reactors, can be employed.

Substrate Surfaces

According to some aspects of the present disclosure, selective deposition can be used to deposit films of interest, such as silicon oxide films, on a metal or metallic surface preferentially relative to an oxide surface, or other dielectric surface. Such a substrate is illustrated schematically in FIG. 2A. In some embodiments the two surfaces are at least partially adjacent to each other on the substrate. Selective passivation of the oxide surface, such as selective silylation of the oxide surface, relative to the metal or metallic surface, facilitates subsequent selective deposition of a metal catalyst on the metal or metallic surface followed by selective deposition of a silicon oxide layer on the metal or metallic surface relative to the silylated oxide surface.

In some embodiments, one of the surfaces can be a conductive metal or metallic surface of a substrate, while the other dielectric surface can be a non-conductive oxide surface of the substrate. In some embodiments, the non-conductive oxide surface comprises —OH groups, such as a silicon oxide-based surface (e.g., low-k materials, including grown and deposited silicon-oxide materials and native oxide over silicon). The oxide surface can be selectively passivated relative to the metal or metallic surface by exposure to a silylation agent. This is followed by exposure to a metal catalyst and subsequently silicon oxide can be selectively deposited on the metal or metallic surface relative to the silylated oxide surface.

The material differences between the two substrate surfaces are such that vapor deposition methods can selectively passivate the oxide surface relative to the metal or metallic surface. In some embodiments, cyclical vapor deposition is used, for example, cyclical chemical vapor deposition (CVD) or atomic layer deposition (ALD) processes. In some embodiments, selectivity for the passivation layer can be achieved without passivation/blocking agents on the metal or metallic surface (to receive less of the passivation layer), and/or without catalytic agents on the surface of the dielectric layer to receive more of the passivation layer. For example, in embodiments where the first surface is an oxide and the second surface is metallic, the oxide layer can be selectively silylated relative to the metal or metallic surface without pretreatment of the oxide surface or the metal or metallic surface.

In some embodiments, the metal or metallic surface is first treated to inhibit passivation (such as silylation) of that surface. In some embodiments the passivation blocking layer is a polymer layer. In some embodiments a passivation blocking self-assembled monolayer (SAM) can be first formed over a metal or metallic surface relative to an oxide surface, facilitating selective deposition of a passivation layer on the oxide surface relative to the SAM-covered metallic surface. The passivation inhibitor can be removed after selective passivation and prior to deposition of the catalyst and the subsequent deposition of the silicon oxide. After selective deposition of the passivation layer is completed, selective deposition of materials of interest, such as the catalyst and/or the silicon oxide, can be conducted on the non-passivated metal or metallic surface relative to the passivated surface.

As used herein, unless otherwise specified if a surface is referred to as a metal surface herein, it may be a metal surface or a metallic surface. In some embodiments, the metal or metallic surface may comprise surface oxidation. In some embodiments, the material of the metal surface is electrically conductive with or without surface oxidation. In some embodiments, a metal surface comprises one or more transition metals. In some embodiments, a metal surface comprises one or more of Al, Cu, Co, Ni, W, Nb, Fe, or Mo. In some embodiments a metal surface comprises Cu. In some embodiments a metal surface is a copper surface. In some embodiments, a metallic surface comprises titanium nitride. In some embodiments, the metal surface comprises one or more noble metals, such as Ru. In some embodiments, the metal surface comprises a metal oxide, such as a conductive metal oxide, metal nitride, metal carbide, metal boride, or combination thereof. For example, the metal or metallic surface may comprise one or more of $RuO_x$, $NbC_x$, $NbB_x$, $NiO_x$, $CoO_x$, $NbO_x$, $MoO_x$, $WO_x$, $WNC_x$, TaN, or TiN.

In some embodiments, the metal or metallic surface is a surface that can accept or coordinate with a reactant utilized in a selective deposition process of the aluminum catalyst, as described herein.

As mentioned above, in some embodiments, the metal or metallic surface may comprise a passivation blocking layer thereover. That is, in some embodiments, the metal or metallic surface may comprise a material that inhibits formation of a passivation layer on the metal or metallic surface, for example a self-assembled monolayer (SAM). In some embodiments a deposition process includes forming the passivation blocking layer on the metal or metallic surface but not on the surface to be passivated. Following formation of the passivation layer on the dielectric surface, the passivation blocking layer may be removed, if necessary or desired.

Passivation of Substrate Surfaces

In some embodiments an oxide or other dielectric surface of a substrate may be passivated. In some embodiments, the passivation is selective for the oxide surface relative to another surface, such as a metal or metallic surface on the same substrate (see, e.g., FIG. 2B). In some embodiments the oxide surface is silylated by exposure to a vapor phase silylating agent one or more times. For example, in a passivation step, a silylating agent may be conducted into the reaction space and contacted with the substrate surface. The silylation agent may be, for example, a chlorosilane, alkoxysilane, silyl halide, silylcyanate, silylazide, silylisocyanate, silylisothiocyanate, silylsulfonate, silylacetamide, silylcarbodiimide, allylsilane, or nitrogen-bearing silane such as a silazane, imidazole or amine. In some embodiments the silylating agent is allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA) and silylation comprises exposing the substrate to one or more pulses of the silylation agent. In some embodiments both the metal or metallic surface and oxide surface are contacted with the silylating agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA). In some embodiments the oxide surface of a substrate is selectively silylated relative to a metal or metallic surface of the substrate.

In some embodiments the silylating agent is an alkylaminosilane. For example, the oxide surface of the substrate may be contacted with an alkylaminosilane having the formula $(R^I)_3Si(NR^{II}R^{I}u)$, wherein $R^I$ is a linear or branched $C_1$-$C_5$ alkyl group or a linear or branched $C_1$-$C_4$ alkyl group, $R^{II}$ is a linear or branched $C_1$-$C_5$ alkyl group, a linear or branched $C_1$-$C_4$ alkyl group, or hydrogen, and $R^{III}$ is a linear or branched $C_1$-$C_5$ alkyl group or a linear or branched $C_1$-$C_4$ alkyl group.

In some embodiments the silylating agent is a silane. For example, the oxide surface may be contacted with a silane having the general formula $(R^I)_3SiA$, wherein $R^I$ is a linear or branched $C_1$-$C_5$ alkyl group or a linear or branched $C_1$-$C_4$ alkyl group, and A is any ligand which is reactive with a silicon containing surface.

The silylating agent may be provided to the reaction chamber holding the substrate in a single pulse or in a sequence of multiple pulses. In some embodiments the silylating agent is provided in a single long pulse or in multiple shorter pulses. The pulses may be provided sequentially. In some embodiments the silylating agent is provided in 1 to 25 pulses of from about 0.1 to about 60 seconds. In some embodiments the silylating agent is provided in a single pulse of about 0.1 to about 60 seconds, about 1 to about 30 seconds or about 25 seconds. In between pulses, the silylating agent may be removed from the reaction space. For example, the reaction chamber may be evacuated and/or purged with an inert gas. The purge may be, for example for about 1 to about 30 seconds or more. Purging the reaction chamber means that vapor phase passivation agent and/or vapor phase byproducts, if any, are removed from the reaction chamber such as by, evacuating the chamber with a vacuum pump and/or by replacing the gas inside the reactor with an inert gas such as argon or nitrogen. In some embodiments the substrate is moved from a reaction space comprising the passivation agent.

In some embodiments, the temperature of the silylation process may be, for example, from about 50 to about 500° C., or about 100 to about 300° C. The pressure during the silylation process may be, for example, from about $10^{-5}$ to about 760 Torr, or in some embodiments from about 1 to about 10 Torr or about 0.1 to about 10 Torr.

In some embodiments, the silylation process may be carried out in situ, that is in the same reaction chamber as a subsequent deposition process, for example selective deposition of an aluminum catalyst on the non-silylated surface relative to the silylated surface and/or the subsequent selective deposition of silicon oxide on the non-silylated surface relative to the silylated surface. However, in some embodiments the silylation may be carried out in a separate reaction chamber from one or more subsequent processing steps. In some embodiments the reaction chamber in which the silylation is carried out is part of a cluster tool, including one or more additional reaction chambers. For example, such a cluster tool may include additional reaction chambers for the deposition of the aluminum catalyst, the deposition of silicon oxide, and/or for etching one or more layers. In some embodiments a cluster tool includes separate modules for pretreatment, silylation of the oxide surface, selective deposition of catalyst, selective deposition of silicon oxide and subsequent post-deposition treatment, such as etching to remove the silylation or plasma post-deposition cleaning. In some embodiments the same module can be used for two or more processes.

In some embodiments, the substrate may be pretreated or cleaned prior to or at the beginning of the passivation and/or one or more of the selective deposition processes. In some embodiments, the substrate may be subjected to a plasma cleaning process prior to or at the beginning of the selective passivation and/or selective deposition processes. In some embodiments, a plasma cleaning process may not include ion bombardment, or may include relatively small amounts of ion bombardment. In some embodiments the substrate surfaces may be exposed to plasma, radicals, excited species, and/or atomic species prior to or at the beginning of the passivation process, and/or the selective metal oxide deposition process. In some embodiments, the substrate surface may be exposed to hydrogen plasma, radicals, or atomic species prior to or at the beginning of the selective passivation process and/or the selective metal oxide deposition process.

In some embodiments the dielectric surface is not passivated prior to selectively depositing the catalyst on the metal surface relative to the dielectric surface.

Selective Deposition of Metal Catalyst on Metal or Metallic Surfaces Relative to Oxide Surfaces A catalyst for the subsequent deposition of silicon oxide can be selectively deposited on a metal or metallic surface of a substrate relative to the dielectric surface of the substrate. This surface comprising the catalyst may be referred to as the catalyzed metal surface. In some embodiments passivation of the dielectric surface is not necessary and the catalyst is selectively deposited on the metal surface relative to the dielectric surface, where the dielectric surface has not been passivated. However, in some embodiments the selective deposition of the catalyst is facilitated or improved by the passivation of the dielectric surface as described above. Thus, in some embodiments, the catalyst is selectively deposited on a metal or metallic surface relative to a passivated dielectric surface. As shown in FIG. 2C, in some embodiments an aluminum catalyst is selectively deposited on the metal surface relative to a dielectric surface that has been passivated with a silylating compound as described herein.

After selectively forming a passivation layer on the dielectric surface, in some embodiments a catalyst is selectively deposited on the second surface by contacting the substrate with a catalyst compound. The catalyst forms up to a molecular layer of catalytic sites on the metal substrate surface. The catalyst compound preferably catalyzes the formation of silicon oxide from a vapor phase silanol reactant, as described below. Briefly, the substrate is exposed to silanol, such as TPS, and a silicon oxide film, such as a silicon dioxide film, for example a $SiO_2$ film is formed, typically comprising multiple molecular layers. The cycle of exposure to the catalyst and the silanol can be repeated, if necessary, to deposit a silicon dioxide film of a desired thickness. In some embodiments, the concentration of the silanol can be controlled to achieve a desired deposition rate. In some embodiments, the substrate temperature can be controlled to achieve a desired deposition rate. In some embodiments a catalyst is not necessary and the metal surface itself catalyzes the deposition of silicon oxide from silanol.

In some embodiments the catalyst is a metal catalyst. The catalyst may be, for example, a metal compound comprising Zn, Mg, Mn, La, Hf, Al, Zr, Ti, Sn, or Ga. In some embodiments the catalyst is a metal halide, organometallic or metalorganic compound.

In some embodiments the catalyst comprises boron. In some embodiments the catalyst is an alkylaluminium, alkylboron or alkylzinc compound that is able to react with the hydrophobic surface. For example, the catalyst may comprise trimethyl aluminum (TMA), triethylboron (TEB), or diethyl zinc.

In some embodiments the catalyst comprises a compound having the formula $MR_xA_{3-x}$, wherein x is from 1 to 3, R is a $C_1$-$C_5$ alkyl ligand, M is B, Zn, Mg, Mn, La, Hf, Al, Zr, Ti, Sn, or Ga and A is a halide, alkylamine, amino, silyl or a derivative thereof. In some embodiments the R is a $C_1$-$C_3$ alkyl ligand. In some embodiments the R is a methyl or ethyl group. In some embodiments the M is boron. In some embodiments the catalyst is $ZnR_xA_{2-x}$, wherein x is from 1 to 2, R is a $C_1$-$C_5$ alkyl ligand, and A is a halide, alkylamine, amino, silyl or a derivative thereof. In some embodiments the R is a $C_1$-$C_3$ alkyl ligand. In some embodiments the R is a methyl or ethyl group.

In some embodiments the catalyst is an aluminum catalyst. Examples of Al compounds that can be used include trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA). In some embodiments the aluminum catalyst comprises is a heteroleptic aluminum compound. In some embodiments the heteroleptic aluminum compound comprises an alkyl group and another ligand, such as a halide, for example Cl. In some embodiments the aluminum catalyst comprises dimethylaluminum chloride. In some embodiments the aluminum catalyst comprises an alkyl precursor comprising two different alkyl groups as ligands. In some embodiments the aluminum compound is an aluminum isopropoxide. In some embodiments the aluminum catalyst comprises a metalorganic compound. In some embodiments the aluminum catalyst comprises an organometallic compound. In some embodiments the aluminum catalyst is an aluminum compound such as trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA).

In some embodiments the catalyst is a zirconium compound, such as $Zr\text{-}DO_4$. In some embodiments the catalyst is tetrakis(ethylmethylamino)zirconium (TEMAZ). In some embodiments the catalyst is $ZrCl_4$.

In some embodiments the catalyst is a lanthanum compound, such as tris(isopropyl-cyclopentadienyl)lanthanum ($LA(iPrCp)_3$).

In some embodiments the catalyst is a titanium compound, such as titanium isopropoxide (TTIP) or $TiCl_4$.

In some embodiments the catalyst is a gallium compound, such as trimethylgallium (TMG).

In some embodiments the catalyst is a hafnium compound, such as $HfCl_4$ or $Hf(NO_3)_4$.

The catalyst may be provided to the reaction chamber holding the substrate in a single pulse or in a sequence of multiple pulses. In some embodiments the catalyst is provided in a single long pulse or in multiple shorter pulses. The pulses may be provided sequentially. In some embodiments the catalyst is provided in 1 to 25 pulses of from about 0.1 to about 60 seconds. In some embodiments the catalyst is provided in a single pulse of about 0.1 to about 60 seconds, about 1 to 30 seconds or about 25 seconds. In between pulses, excess catalyst may be removed from the reaction space. For example, the reaction chamber may be evacuated and/or purged with an inert gas. The purge may be, for example for about 1 to 30 seconds or more. Purging means that vapor phase catalyst and/or vapor phase byproducts, if any, are removed from the reaction chamber such as by evacuating the chamber with a vacuum pump and/or by replacing the gas inside the reaction chamber with an inert gas. In some embodiments vapor phase catalyst is removed from the substrate surface by moving the substrate from the reaction space comprising the vapor phase catalyst.

In some embodiments, the temperature of the selective catalyst deposition may be, for example, from about 50 to about 500° C., or about 100 to about 300° C. In some embodiments, the deposition temperature is between about 50° C. and about 400° C. In some embodiments the deposition temperature is greater than about 100° C. and the catalytic chemical is an alkylaluminum compound, such as TMA. In some embodiments the catalytic chemical is an alkylboron compound, such as TEB, and the deposition temperature is between about 50° C. and about 400° C., between about 100° C. and about 350° C., or between about 100° C. and about 300° C. In some embodiments the catalytic chemical is an alkylboron compound and the temperature is greater than about 100° C. In some embodiments the deposition temperature is greater than about 300° C. and the catalytic chemical is TEB.

In some embodiments the catalyst comprises a metal compound that is selectively deposited by contacting the substrate with a metal precursor and an oxygen reactant. In some embodiments the catalyst comprises a metal oxide. In some embodiments the metal compound is selectively deposited by an ALD process. In some embodiments the substrate is simultaneously or sequentially contacted with a first metal precursor and a second reactant comprising oxygen in one, two or more deposition cycles. In some embodiments the deposition process comprises a plurality of deposition cycles in which the substrate is alternately and sequentially contacted with the first metal precursor and the second reactant.

In some embodiments the first metal precursor is a hydrophobic Lewis acid. The hydrophobic metal reactant may comprise at least one hydrophobic hydrocarbon ligand, such as alkyl, alkenyl, cyclic $C_3$-$C_8$ or aromatic groups. In some embodiments the first metal precursor may be bis(methylcyclopentadienyl)methoxymethyl zirconium.

In some embodiments the first metal precursor comprises a transition metal. In some embodiments the first precursor does not comprise a noble metal, such as Ru.

In some embodiments the first metal precursor may comprise at least one alkyl ligand, such as a $C_1$-$C_4$ alkyl ligand. In some embodiments the first metal precursor may comprise an organometallic or metalorganic compound. In some embodiments the first metal precursor may comprise at least one cyclopentadienyl (Cp) ligand. In some embodiments the first metal precursor may comprise a formamidinate or an amidinate compound. In some embodiments the first metal precursor may comprise a beta-diketonate compound. In some embodiments the first metal precursor may comprise an alkylamino compound, such as a dialkylamino compound. In some embodiments the first metal precursor may comprise an alkylamino ligand, such as $—NMe_2$, $—NEt_2$ or -NEtMe.

In some embodiments the first metal precursor may comprise magnesium. In some embodiments the first metal precursor may be an organometallic or a metalorganic compound comprising magnesium. For example, in some embodiments the first metal precursor may comprise $Mg(Cp)_2$ or a derivative thereof.

In some embodiments the first metal precursor may comprise lanthanum. In some embodiments the first metal precursor may be an organometallic compound comprising lanthanum. In some embodiments the first metal precursor may comprise lanthanum formamidinate ($La(FAMD)_3$).

In some embodiments the first metal precursor may comprise hafnium. In some embodiments the first metal precursor may comprise an organometallic compound comprising hafnium. For example, in some embodiments the first metal precursor may comprise alkylamino hafnium compound, such as Tetrakis(ethylmethylamino)hafnium (TEMAH, $Hf(NEtMe)_4$) or a derivative thereof.

In some embodiments, the first metal precursor has the following formula:

$$MgL_2 \qquad (I)$$

wherein Mg is magnesium, and wherein each L can be independently selected to be a hydrocarbon group. In some embodiments each L can be linear, branched, cyclic alkyl or unsaturated hydrocarbon group, such as alkenyl, alkynyl, aromatic, cyclopentadienyl, phenyl, cyclooctadienyl, or cycloheptatrienyl group. In some embodiments one or both L can be a cyclopentadienyl group. In some embodiments, one or both L can be a bidentate ligand, such as beta-diketonate, guanidinate, or amidinate. In some embodiments, the beta-diketonate ligand can be acetylacetonate or 2,2,6,6-tetramethyl-3,5-heptanedionato (THD).

In some embodiments, the first metal precursor is a cyclopentadienyl compound or a derivative thereof, such as alkyl-substituted cyclopentadienyl compound and have the following formula:

$$Mg(R^1R^2R^3R^4R^5Cp)_2 \quad (II)$$

wherein each of the $R^1$ groups, each of the $R^2$ groups, each of the $R^3$ groups, each of the $R^4$ groups, and each of the $R^5$ groups can be independently selected to be hydrogen or a substituted or unsubstituted alkyl group. In some embodiments each of the $R^1$ groups, each of the $R^2$ groups, each of the $R^3$ groups, each of the $R^4$ groups, and each of the $R^5$ groups can be independently selected to be hydrogen or a linear or branched $C_1$-$C_5$ alkyl group. In some embodiments each of the $R^1$ groups, each of the $R^2$ groups, each of the $R^3$ groups, each of the $R^4$ groups, and each of the $R^5$ groups can be independently selected to be hydrogen or a $C_1$-$C_3$ alkyl group, such as methyl, ethyl, n-propyl or i-propyl group. In some embodiments the first precursor is $Mg(Cp)_2$.

In some embodiments, the first metal precursor comprises one or more ligands, such as cyclopentadienyl ("Cp") ligands. These first precursor compounds can be selected from a group consisting of the following compounds:

$$(Cp)_xLa \quad (III);$$

$$(Cp)_xL_yLa \quad (IV);$$

$$(Cp)_xW_nLa \quad (V);$$

$$(CP)_xL_yW_nLa \quad (VI);$$

La is lanthanum, Cp is a cyclopentadienyl or a cyclooctadienyl group, so that Cp groups in chemical formulas I-IV can be the same as each other or different from one other; x denotes the number of the Cp ligands and it is an integer from 1 up to the oxidation state of La; it should be noted that cyclooctadiene is usually shortened as Cod, but here the presentation is simplified by the use of the single common abbreviation Cp for both cyclopentadienyl and cyclooctadienyl;

$L_y$ is a neutral adduct ligand that bounds from one or more of its atoms to the metal and wherein y denotes the number of the bound ligands; and W is some other ligand with a valence of one less than Cp and where n denotes the number of ligands. In some embodiments W is amidinate or formamidinate. In some embodiments W is a beta-diketonate or its corresponding sulfur or nitrogen compound, halide, amide, alkoxide, carboxylate or Schiff's base.

In the chemical equations I-IV, the cyclopentadienyl and/or cyclooctadienyl groups can be in the same molecule, so that there is a bridge between two Cp-groups consisting of a substituted or unsubstituted $C_1$-$C_6$ chain that may contain a heteroatom selected from Si, N, P, Se, S or B.

In some embodiments L is an independently selected:

(i) a hydrocarbon,
(ii) a hydrocarbon that contains oxygen,
(iii) a hydrocarbon that contains nitrogen,
(iv) a hydrocarbon that contains sulfur,
(v) a hydrocarbon that contains phosphor,
(vi) a hydrocarbon that contains arsenic,
(vii) a hydrocarbon that contains selenium and/or
(viii) a hydrocarbon that contains tellurium In some embodiments L is and independently selected:

(a) amine or polyamine,
(b) bipyridine,
(c) a ligand according to a chemical diagram:

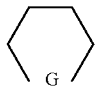

wherein G is —O—, —S—, or —$NR^1$, where $R^1$ is an independently selected hydrogen or substituted or unsubstituted, cyclic, linear or branched, alkyl, alkenyl, aryl, alkylaryl, arylalkyl, alkoxy, thio, cyano or silyl group. A cyclic or aromatic ring in $R^1$ may contain a heteroatom. Hydrogen or a $R^1$-type substituent may also be attached to the carbon atoms in chemical equation V, or (d) ether or thioether.

Cyclopentadienyl or cyclooctadienyl groups, Cp in chemical formulas I-IV have the form:

$$Cp'R_mH_{a-m} \quad (VII)$$

wherein m is an integer from 0-8 when a is 8 and m is an integer from 0-5 when a is 5, Cp' is fused or isolated cyclopentadienyl or cyclooctadienyl, and R is an independently selected hydrocarbon fragment containing 1-6 carbon atoms, such as a $C_1$-$C_6$ hydrocarbon.

In some embodiments each R ligand can be the same as each other R ligand, or each R ligand may different from one another. That is, each R ligand can be independently selected. In some embodiments R can be a substituted or unsubstituted, cyclic, linear or branched, alkyl alkenyl, aryl, alkylaryl, arylalkyl, alkoxy, thio, amino, cyano or silyl group. The cyclic or aromatic ring of the substituent may contain a heteroatom. Examples of the substituents are methyl, ethyl, propyl and isopropyl groups.

Neutral adduct ligands L shown in chemical equations II and IV can be independently selected ethers, amines or solvent molecules such as tetrahydrofuran that form a bond to the metal with one atom. Examples of suitable neutral adduct ligands that form a bond to a metal with several atoms are polyethers and polyamines.

In some embodiments a first metal precursor may comprise at least one cyclopentadienyl ligand and can be written according to Formula VIII:

$$(R^1R^2R^3R^4R^5Cp)_x\text{-}MR^0_z\text{—}(R^6)_y \quad (VIII)$$

wherein M is a metal selected from the group consisting of Mg, Sr, Ba, Sc, Y and lanthanides;

wherein each of the $R^0$ groups, each of the $R^1$ groups, each of the $R^2$ groups, each of the $R^3$ groups, each of the $R^4$ groups, and each of the $R^5$ groups can be independently selected from:

i. hydrogen;
ii. linear and branched $C_1$-$C_6$ alkyl, alkenyl and alkynyl groups, which are independently substituted or unsubstituted;
iii. carbocyclic groups, such as aryl, phenyl, cyclopentadienyl, alkylaryl, and halogenated carbocyclic groups; and iv. heterocyclic groups;

wherein $R^6$ is independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups;

iv. heterocyclic groups; and v. $NR^1R^2$; and wherein both x and y are ≥1 and z≥0.

In some embodiments, a first metal precursor comprising a cyclopentadienyl compound comprises at least one ligand that is bonded to a metal via nitrogen as depicted by Formula IX:

$$(R^1R^2R^3R^4R^5Cp)_x\text{-}MR^0_z\text{—}(NR^1R^2)_y \qquad \text{(IX)}$$

wherein M is a metal selected from the group consisting of Mg, Sr, Ba, Sc, Y or lanthanides;

wherein each of the $R_0$ groups, each of the $R_1$ groups, each of the $R_2$ groups, each of the $R_3$ groups, each of the $R_4$ groups, and each of the $R_5$ groups is independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In Formula IX, the alkyl, alkenyl and alkynyl groups can be selected from any linear or branched alkyl, alkenyl and alkynyl groups which have 1 to 6 carbon atoms. Examples of such alkyl groups include methyl; ethyl; n- and i-propyl-; n-, i- and t-butyl-; n- and isoamyl; n- and isopentyl; n- and isohexyl; and 2,3-dimethyl-2-butyl. In some embodiments, alkyl groups are used. In other embodiments the $C_{1-6}$, alkenyl and alkynyl groups include the corresponding groups having a corresponding degree of unsaturation can be used.

In some embodiments the first metal precursor is a compound having at least one cyclopentadienyl ligand and at least one chelating ligand, for example, a bidentate ligand. In some embodiments, this compound is depicted by Formula X, $(R^1R^2R^3R^4R^5Cp)_x$-$MR^0_z$—$(NR^1NR^2R)_y$, as follows:

(X)

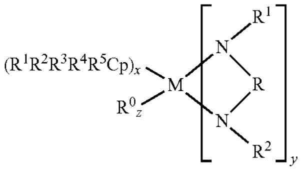

wherein M is a metal selected from the group consisting of Mg, Sr, Ba, Sc, Y or lanthanides;

wherein R can be any linear and branched $C_1$-$C_6$ alkyl, alkenyl or alkynyl groups, which are independently substituted or unsubstituted and R can be bonded to two bridging nitrogen atoms any point of alkyl, alkenyl and alkynyl groups;

wherein each of the $R^0$ groups, each of the $R^1$ groups, each of the $R^2$ groups, each of the $R^3$ groups, each of the $R^4$ groups, and each of the $R^5$ groups can be independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In some other embodiments, the first metal precursor can be depicted by Formula XI, $(R^1R^2R^3R^4R^5Cp)_x$-$MR^0_z$—$[(NR^1NR^2)CNR^3]_y$, as follows:

(XI)

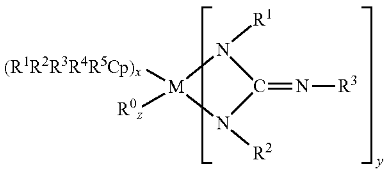

wherein M is a metal, selected from the group consisting of Mg, Sr, Ba, Sc, Y or lanthanides;

wherein each of the $R^0$ groups, each of the $R^1$ groups, each of the $R^2$ groups, each of the $R^3$ groups, each of the $R^4$ groups, and each of the $R^5$ groups can be independently selected from i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In further embodiments, the first metal precursor is depicted by Formula XII, $(R^1R^2R^3R^4R^5Cp)_x$-$MR^0_z$—$[(NR^1NR^2)CNR^3R^4]_y$, as follows:

(XII)

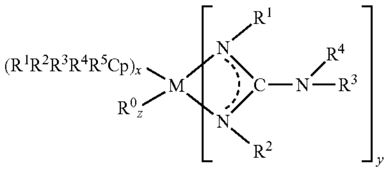

wherein M is a metal, selected from the group consisting of Mg, Sr, Ba, Sc, Y or lanthanides;

wherein each of the $R^0$ groups, each of the $R^1$ groups, each of the $R^2$ groups, each of the $R^3$ groups, each of the $R^4$ groups, and each of the $R^5$ groups can be independently selected from:

i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, alkylaryl, and halogenated carbocyclic groups; and iv. heterocyclic groups; and wherein both x and y are ≥1 and z≥0.

In some embodiments, the first metal precursor as described in Formulae VIII-XII may comprise $R^0$, $R^1$, $R^2$, $R^3$, $R^4$, $R^5$, and $R^6$ wherein each of the $R^0$ groups, each of the $R^1$ groups, each of the $R^2$ groups, each of the $R^3$ groups, each of the $R^4$ groups, and each of the $R^5$ groups, and each of the $R^6$ groups can be independently selected from i. hydrogen;

ii. linear and branched $C_1$-$C_6$ alkyl, alkenyl and alkynyl groups, which are independently substituted or unsubstituted;

iii. carbocyclic groups, such as aryl, phenyl, cyclopentadienyl, and alkylaryl; and iv. heterocyclic groups Optionally, a first metal precursor as described may comprise modified cyclopentadienyl groups. In some embodiments, the modified cyclopentadienyl groups are selected from the group consisting of $Me_5Cp$, MeCp, EtCp, and $Me_3SiCp$. In further embodiments, the first metal precursor may comprise an anionic or dianionic guanidinate ligand such as a triisopropylguandinate ligand.

In some embodiments the second reactant comprises oxygen and may be referred to herein as the oxygen precursor, oxygen reactant, oxygen-containing precursor, or oxygen-containing reactant. In some embodiments the second reactant comprises molecular oxygen ($O_2$). In some embodiments the second reactant does not comprise a compound comprising oxygen other than $O_2$. In some embodiments the second reactant does not comprise $O_3$ or $H_2O$. In some embodiments the second reactant does not comprise a plasma, for example an oxygen plasma. In some embodiments the second reactant is supplied with or mixed with inert gas such as $N_2$, He or Ar.

In some embodiments the second reactant comprises molecular oxygen and less than about 50%, 25%, 15%, 10%, 5%, 1%, or 0.1% of impurities other than inert gases.

In some embodiments, the selective catalyst deposition process may be carried out in situ, that is in the same reaction chamber as prior passivation and/or a subsequent deposition process, for example the subsequent selective deposition of silicon oxide on the non-silylated surface relative to the silylated surface. However, in some embodiments the selective catalyst deposition may be carried out in a separate reaction chamber from one or more subsequent processing steps, for example in one chamber that is part of a cluster tool.

In some embodiments, the substrate and in particular the metal surface may be pretreated or cleaned prior to or at the beginning of the selective catalyst deposition.

Selective Deposition of Silicon Oxide on Catalyzed Metal Surfaces Relative to Dielectric Surfaces Following passivation of the dielectric surface (if conducted) and selective deposition of the catalyst on the metal surface (if conducted), silicon oxide can be selectively deposited on the metal surface of the substrate relative to the dielectric surface. In some embodiments, silicon oxide is selectively deposited on the metal surface by contacting the substrate with a silicon reactant, such as a silanol (see, e.g., FIG. 2D). In some embodiments the substrate surface is contacted with a silicon reactant and an oxygen reactant, such as $H_2O$. The formation of silicon oxide is catalyzed by the presence of the catalyst on the metal surface, or by the metal surface itself if a catalyst is not employed.

One or more silanols can be used as the silicon reactant, such as alkoxysilanols or alkoxysilanediols. In some embodiments the silicon reactant may comprise on or more tris(tert-alkoxy)silanols, di(alkoxy)alkylsilanols, di(alkoxy) silanediols or bis(tert-alkoxy)silanediols. In some embodiments the silanol may be selected from one or more of tris(tert-butoxy)silanol (TBS), tris(isopropoxy)silanol (TIS), and tris(tert-pentoxy)silanol (TPS). Silanols are compounds comprising silicon bound to one or more hydroxyl (OH) groups. In some embodiments, the silanols comprise more than one OH— group bonded directly to the silicon atom. Silanol compounds include, without limitation, alkoxysilanols, alkoxyalkylsilanols, and alkoxysilanediols. In some embodiments, the silicon precursor comprises TPS. In some embodiments the silicon source is di(alkoxy)silanediol.

In some embodiments only a single silanol pulse is provided after the catalyst has been deposited on the metal surface. In some embodiments a single silanol pulse is used to deposit a silicon dioxide film with a thickness measured on the top surface of the metal surface on the substrate of more than 5 angstroms. As discussed above, in some embodiments the substrate can be contacted with the catalyst and the silanol in one or more silicon oxide deposition sub-cycles. The sub-cycles may be repeated until a silicon oxide film of the desired thickness has been selectively formed over the metal surface. In some embodiments, a single sub-cycle may be all that is required to obtain a silicon dioxide film of a desired thickness. In other embodiments the steps may be repeated 2, 3, 4, 5, 6, 7, 8, 9, 10, or more times.

In some embodiments, more than one silanol pulse is provided in each deposition super-cycle. For example, a catalyst pulse can be followed by two, three or more silanol pulses. In some embodiments, a catalyst pulse is followed by two silanol pulses. Each silanol pulse may be separated by a purge step. In other embodiments, each silanol pulse is provided after a predetermined time delay, without an intervening purge step.

Although generally described as beginning with provision of the catalyst, each silicon oxide deposition sub-cycle can begin with either reactant. However, as will be recognized by the skilled artisan, if the first sub-cycle begins with the silanol reactant, deposition may not begin until the second deposition super-cycle.

With respect to the catalyst, surface saturation ensures catalyst occupation of all available reactive sites (subject, for example, to physical size or "steric hindrance" restraints) and thus ensures excellent step coverage. However, in some embodiments, the catalyst can be provided in a non-saturating or under-saturating dose. For example, in deep trench structures it is important to form a "collar," which is an etch-stop layer that must extend only part of the way down the trench. In this example, under-saturated pulses of the catalyst can be used to preferentially deposit the catalyst along the collar area in comparison to surfaces further down in the trench. As a result, the silicon dioxide deposition only occurs to the depth the catalyst reached and thus the extent of silicon dioxide deposition is limited to a desired depth. Thus, in some embodiments, the dose of the catalyst is metered in order to provide a predetermined amount of catalyst and a predetermined amount of deposition of silicon dioxide.

With respect to the silanol reactant, in some embodiments a saturating pulse of silanol is provided. However, because the growth rate of silicon dioxide depends, in part, on diffusion of the precursor through the growing film, the growth rate can be controlled, for example by controlling precursor dose, purge time and/or temperature. Thus, in some embodiments a non-saturating dose of silanol can be provided. In some embodiments the dose of the silanol reactant and/or exposure time may be limited to provide silicon dioxide to a particular thickness and/or to a particular depth in a given reaction cycle.

In some embodiments a silicon dioxide thin film is selectively formed on a metal surface of a substrate relative to a dielectric surface by selecting a catalyst that is able to react with the metal surface and carrying out a deposition process comprising one or more silicon dioxide deposition sub-cycles, each silicon dioxide deposition sub-cycle comprising:

- providing a first vapor phase reactant pulse comprising a metal catalyst into the reaction chamber to form no more than about a single molecular layer of the catalyst on the metal surface of the substrate;
- removing excess catalyst from the reaction chamber;
- providing a second vapor phase reactant pulse comprising a silanol to the reaction chamber; and
- removing excess second reactant and reaction byproducts, if any, from the reaction chamber.

In some embodiments a silicon oxide thin film is selectively deposited on one or more metal or metallic surfaces, such as a copper, cobalt, titanium nitride or tungsten surfaces, relative to one or more dielectric surfaces.

The thickness of the film can be adjusted depending on the particular circumstances. In some embodiments a thin film of silicon dioxide ranging from a few angstroms to a few nanometers is deposited. In some embodiments a thin film of silicon dioxide of less than about 2 nm is deposited. In some embodiments a thin film of silicon dioxide of less than about 3 nm is deposited. In some embodiments one or both of the catalyst and the silanol are underdosed in order to obtain deposition of a film of less than about 2 nm or less than about 3 nm. The thin film may be deposited in one deposition super-cycle or in multiple deposition super-cycles.

Before starting the deposition of the film, the substrate is typically heated to a suitable growth temperature. In some embodiments, the growth temperature of the silicon dioxide thin film is less than about 500° C., less than about 400° C., less than about 300° C., less than about 200° C., less than about 150° C., or even less than about 125° C. Temperatures are typically selected such that the catalyst does not decompose. In some embodiments the deposition process can be performed at temperatures greater than about 100° C., for example with TMA as a catalyst.

In some embodiments the pulse time for the reactants may be from about 0.1 to about 10 seconds, and the purge time between reactant pulses may also be from about 0.1 to about 10 seconds.

The pressure in the reaction chamber is typically from about 0.1 mTorr to about 5 Torr, more preferably from about 0.1 mTorr to about 3 Torr, and most preferably about 0.2 mTorr to about 3 Torr. However, in some cases the pressure will be higher or lower than this range, as can be readily determined by the skilled artisan.

In one embodiment, in a silicon oxide deposition sub-cycle, silicon oxide, such as silicon dioxide, for example $SiO_2$ is deposited on a metal surface of a substrate relative to a passivated dielectric surface at a temperature of about 150° C. TMA is pulsed into the reaction chamber for 150 ms, followed by a 3 s purge. TPS is then pulsed into the reaction chamber for 100 s, followed by a 90 s purge.

Post-Deposition Treatment

Figure 2A:
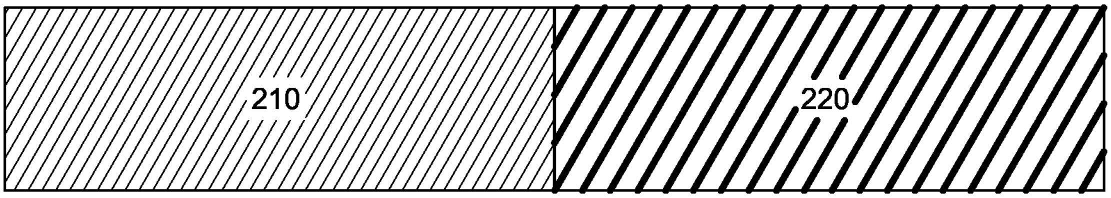
FIG. 2A is a schematic cross section of a portion of a substrate having first dielectric surface and a second adjacent metal surface.
Figure 2B:
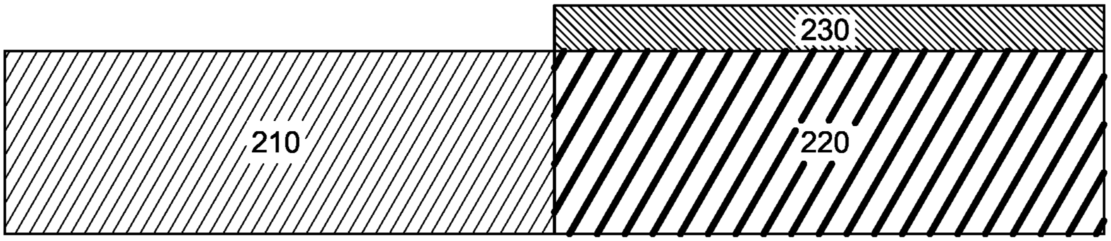
FIG. 2B is a schematic cross section of the substrate of FIG. 2A after a selective passivation of the dielectric surface.
Figure 2C:
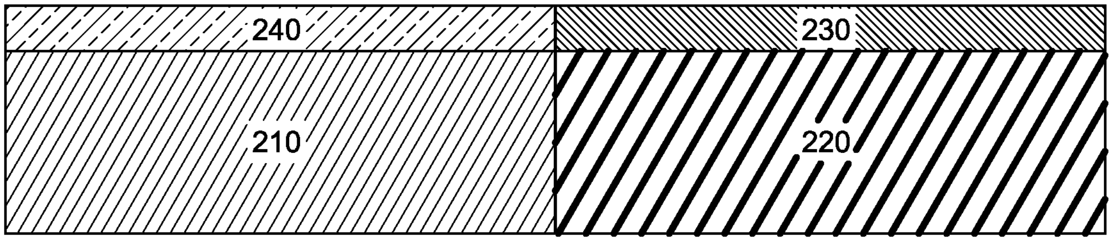
FIG. 2C is a schematic cross section of the substrate of FIG. 2B after selective deposition of an aluminum catalyst on the metal surface.
Figure 2D:
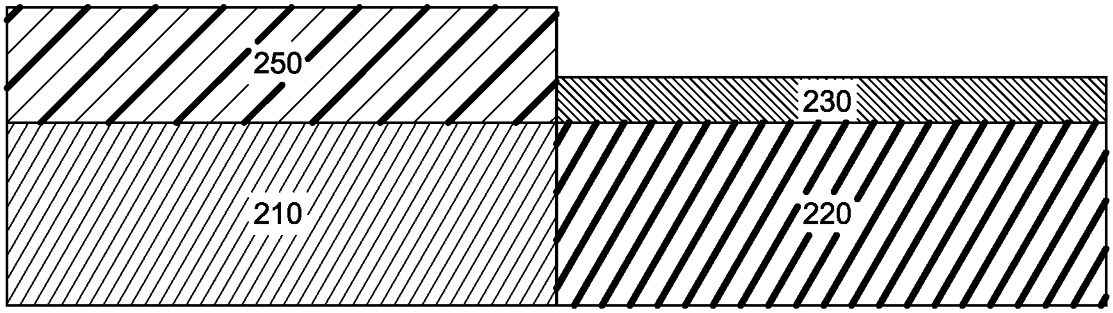
FIG. 2D is a schematic cross section of the substrate of FIG. 2C after selective deposition of silicon oxide on the metal surface.
Figure 2E:
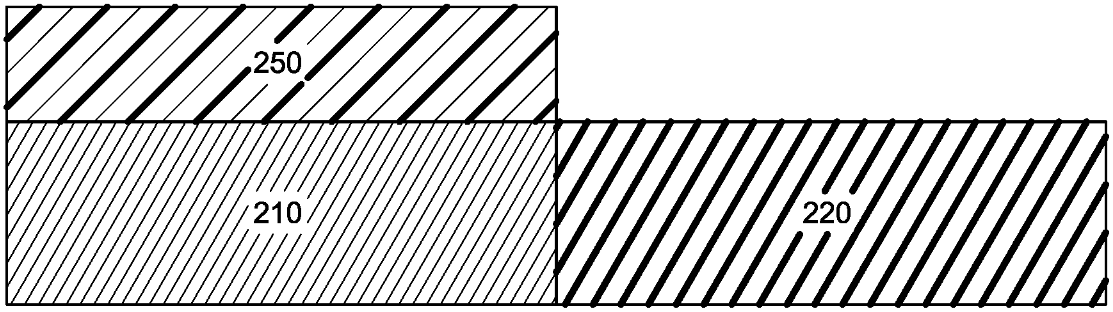
FIG. 2E is a schematic cross section of the substrate of FIG. 2D after removal of the passivation material from the oxide surface.

Following selective deposition of the metal oxide, the substrate may be subjected to a post-deposition cleaning step to remove the passivation layer from the oxide surfaces, as mentioned above (See, e.g., FIG. 2E). In some embodiments the cleaning step may comprise $H_2$ plasma treatment. In some embodiments the cleaning step is carried out at a temperature of about room temperature to about 400° C. In some embodiments plasma power of about 25 to about 250 W may be used to generate a plasma in flowing $H_2$, for example at a flow rate of about 10 to about 500 sccm. The clean time after deposition of the metal oxide layer may be, for example, from about 0.1 to about 600 seconds or more in some embodiments.

In some embodiments a thin silicon oxide film is selectively deposited on a metal or metallic surface of a three-dimensional structure relative to one or more passivated dielectric surfaces. The three-dimensional structure may comprise, for example, a via or a trench. In some embodiments dielectric surfaces may be selectively passivated and an aluminum catalyst deposited on metal surfaces prior to depositing the silicon oxide film.

Passivation Blocking Layer

A passivation blocking layer can facilitate selective formation of a passivation layer on dielectric material relative to the passivation blocking layer. As noted above, in some embodiments a self-assembled monolayer (SAM) can serve to inhibit silylation of a metal or metallic surface, thus facilitating selective passivation of dielectric surfaces. In some embodiments, passivation blocking layers other than SAMs are used. The term "blocking" is thus merely a label and need not imply 100% deactivation of the passivation layer deposition. As noted elsewhere herein, even imperfect selectivity can suffice to obtain a fully selective structure, for example after an etch back process.

Selectivity

Selective passivation and/or selective deposition can be fully selective or partially selective. A partially selective process can be followed by a post-deposition etch that removes all of the deposited material from over one surface without removing all of the deposited material from over a second surface, resulting in a fully selective layer. Thus, in some embodiments the selective deposition need not be fully selective in order to obtain the desired benefits.

Selectivity of deposition (or passivation) on a first surface, here referred to as surface A, relative to a second surface, referred to as surface B, can be given as a percentage calculated by [(deposition on surface A)-(deposition on surface B)]/(deposition on the surface A). Deposition can be measured in any of a variety of ways. For example, deposition may be given as the measured thickness of the deposited material, or may be given as the measured amount of material deposited. In embodiments described herein, an oxide surface (A) can be selectively passivated relative to a metal or metallic surface (B). With respect to passivation, if the passivation results from treatment of the substrate surface rather than deposition of a layer, the amount of passivation can be a measure of available reactive sites on the substrate surface that have reacted with the passivation agent. Subsequently, a metal oxide layer can be selectively deposited on the metal or metallic surface (B) relative to the passivation layer over the oxide surface (A).

In some embodiments, selectivity for the selective formation of the passivation layer on a dielectric surface (relative to a metal or metallic surface) is greater than about 10%, greater than about 50%, greater than about 75%, greater than about 85%, greater than about 90%, greater than about 93%, greater than about 95%, greater than about 98%, greater than about 99%, or even greater than about 99.5%.

In some embodiments, deposition of the catalyst on a metal or metallic surface relative to a passivated dielectric surface is greater than about 10%, greater than about 50%, greater than about 75%, greater than about 85%, greater than about 90%, greater than about 93%, greater than about 95%, greater than about 98%, greater than about 99% or even greater than about 99.5%.

In some embodiments, deposition of the catalyst on a metal or metallic surface relative to an unpassivated dielectric surface is greater than about 10%, greater than about 50%, greater than about 75%, greater than about 85%, greater than about 90%, greater than about 93%, greater than about 95%, greater than about 98%, greater than about 99% or even greater than about 99.5%.

In some embodiments, selectivity of deposition of silicon oxide on a catalyzed metal or metallic surface (relative to a passivated or unpassivated dielectric surface) is greater than about 10%, greater than about 50%, greater than about 75%, greater than about 85%, greater than about 90%, greater than about 93%, greater than about 95%, greater than about 98%, greater than about 99% or even greater than about 99.5%.

In some embodiments, deposition only occurs on one surface and does not occur on the other surface.

In some embodiments, passivation of a dielectric surface by silylation relative to a metal or metallic surface of the substrate is at least about 80% selective. In some embodiments, the passivation process is at least about 50% selective. In some embodiments the passivation process is at least about 10% selective. The skilled artisan will appreciate that a partially selective process can result in a fully selective passivation of the oxide surface by a post-deposition etch that removes any silylation from the other surface.

In some embodiments, deposition of a catalyst on a metal surface relative to a passivated dielectric surface of the substrate is at least about 80% selective. In some embodiments, the catalyst deposition process is at least about 50% selective. In some embodiments the catalyst deposition process is at least about 10% selective. The skilled artisan will appreciate that a partially selective process can result in a fully selective deposition on the metal surface by a post-deposition etch that removes any catalyst from the dielectric surface.

In some embodiments, deposition of silicon oxide on a catalyzed metal or metallic surface of the substrate relative to a silylated oxide surface of the substrate is at least about 80% selective. In some embodiments, deposition of silicon oxide on a catalyzed metal or metallic surface of the substrate relative to a silylated oxide surface of the substrate is at least about 50% selective. In some embodiments deposition of silicon oxide on a catalyzed metal or metallic surface of the substrate relative to a silylated oxide surface of the substrate is at least about 10% selective. The skilled artisan will appreciate that a partially selective process can be followed by a post-deposition etch (or other treatment) that removes substantially all of the deposited material from over the silylated dielectric surface. Furthermore, the post-deposition treatment can also aid in tailoring the position and/or profile of the selectively deposited layer.

Selective Deposition of Silicon Oxide on Metal or Metallic Surfaces

FIGS. 2A-2E schematically illustrate an embodiment for selective passivation of a first dielectric surface relative to a second metal or metallic surface, followed by selective deposition of silicon oxide on the second metal or metallic surface relative to the passivated first oxide surface.

FIG. 2A illustrates a substrate having materially different surfaces exposed. For example, the first surface can comprise or be defined by a dielectric material 220, such as a silicon oxide-based layer or a silicon surface having native oxide formed thereover. The second surface can comprise or be defined by a metal 210, such as copper (Cu).

FIG. 2B shows the substrate of FIG. 2A after selective passivation of the dielectric surface, such as by silylation. For example, a passivation layer 230 may be formed selectively on the dielectric surface 220 by exposing the substrate to a silylating agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

FIG. 2C shows the substrate of FIG. 2B following selective deposition of an aluminum catalyst 240 on the metal surface 210 relative to the passivation layer 230 on the dielectric surface 220. The aluminum catalyst 240 may be formed selectively on the metal surface 210 by exposing the substrate to an aluminum reactant such as trimethylaluminum (TMA), dimethylaluminum chloride, aluminum trichloride ($AlCl_3$), dimethylaluminum isopropoxide (DMAI), tris(tert-butyl)aluminum (TTBA), tris(isopropoxide)aluminum (TIPA) or triethyl aluminum (TEA). Although illustrated with an aluminum catalyst, in other embodiments metal catalysts comprising other metals or other catalysts may be used, as described herein.

FIG. 2D shows the substrate of FIG. 2C following selective deposition of silicon oxide 250 on the catalyzed metal surface 210 relative to the dielectric surface 220. In some embodiments the silicon oxide 250 is formed by exposing the substrate to a silanol reactant, such as tris(tert-pentoxy) silanol. The silanol reactant may decompose on the aluminum atoms on the catalyzed metal surface, leading to the deposition of silicon oxide on the metal surface.

As noted above, any silicon oxide deposited on the dielectric layer, such as on the passivated dielectric layer, can be removed by a post deposition treatment, such as an etch back process. This etch back process may also remove the silylation from the dielectric surface. Because the silicon oxide is deposited selectively on the metal surface, any silicon oxide left on the passivation surface will be thinner than the silicon oxide formed on the metal surface. Accordingly, the post deposition treatment can be controlled to remove all of the silicon oxide over the dielectric surface without removing all of the silicon oxide from over the metal surface. Repeated selective deposition and etching back in this manner can result in an increasing thickness of the silicon oxide on the metal surface with each cycle of deposition and etch. Repeated selective deposition and etching back in this manner can also result in increased overall selectivity of the silicon oxide on the metal or metallic surface, as each cycle of deposition and etch leaves a clean passivation layer over which the selective silicon oxide deposition nucleates poorly. In other embodiments, silicon oxide over the dielectric surface may be removed during subsequent removal of the passivation layer. For example, either a direct etch or a lift-off method can be used to remove silicon oxide from the passivation layer surface in a cyclical selective deposition and removal.

FIG. 2E shows the substrate of FIG. 2D after a post deposition treatment to remove the passivation layer 230 from the dielectric surface 220, such as by an etch process. In some embodiments, the etch process may comprise exposing the substrate to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., or between about 100° C. and about 400° C. In some embodiments, the etchant may be supplied in one continuous pulse or may be supplied in multiple pulses. As noted above, the passivation layer removal can be used to lift-off any remaining metal oxide from over the oxide layer, either in a complete removal of the passivation layer or in a partial removal of the passivation layer in a cyclical selective deposition and removal.

Additional treatments, such as heat or chemical treatment, can be conducted prior to, after, or between the foregoing processes. For example, treatments may modify the surfaces or remove portions of the metal, silicon oxide, passivation and metal oxide surfaces exposed at various stages of the process. In some embodiments the substrate may be pretreated or cleaned prior to or at the beginning of the process. In some embodiments, the substrate may be subjected to a plasma cleaning process, as mentioned above.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of selectively depositing silicon oxide on a metal surface of a substrate relative to a dielectric surface of the substrate, the method comprising, in order:

contacting the substrate with a passivation agent to selectively passivate the dielectric surface relative to the metal surface of the substrate;

contacting the substrate having the dielectric surface thereof selectively passivated with a metal catalyst to selectively deposit the metal catalyst on the metal surface of the substrate relative to the dielectric surface of the substrate to thereby form a catalyzed metal surface, wherein the metal catalyst comprises dimethylaluminum isopropoxide (DMAI); and contacting the substrate having the catalyzed metal surface with a silicon reactant to selectively deposit silicon oxide on the catalyzed metal surface relative to the dielectric surface.

2. The method of claim 1, wherein the step of contacting the substrate with the metal catalyst is greater than 75% selective to the metal surface as compared to the passivated dielectric surface.

3. The method of claim 1, wherein the step of contacting the substrate having the catalyzed metal surface with the silicon reactant is greater than 75% selective to the catalyzed metal surface as compared to the passivated dielectric surface.

4. The method of claim 1, wherein the step of contacting the substrate with the passivating agent is greater than 95% selective to the dielectric surface as compared to the metal surface.

5. The method of claim 1, wherein the step of contacting the substrate with the metal catalyst is greater than 95% selective to the metal surface as compared to the passivated dielectric surface.

6. The method of claim 1, wherein the step of contacting the substrate having the catalyzed metal surface with the silicon reactant is greater than 95% selective to the catalyzed metal surface as compared to the passivated dielectric surface.

7. The method of claim 1, wherein the silicon reactant comprises tris(tert-butoxy) silanol (TBS), tris(isopropoxy) silanol (TIS), or tris(tert-pentoxy) silanol (TPS).

8. The method of claim 1, wherein the silicon reactant comprises a silanol.

9. The method of claim 1, further comprising: after the substrate is contacted with the silicon reactant, cleaning the substrate.

10. The method of claim 9, wherein the cleaning includes treating the substrate with an $H_2$ plasma treatment.

11. The method of claim 1, wherein the step of contacting the substrate with the passivating agent is greater than 75% selective to the dielectric surface as compared to the metal surface.

12. The method of claim 11, wherein the step of contacting the substrate with the metal catalyst is greater than 75% selective to the metal surface as compared to the passivated dielectric surface.

13. The method of claim 12, wherein the step of contacting the substrate having the catalyzed metal surface with the silicon reactant is greater than 75% selective to the catalyzed metal surface as compared to the passivated dielectric surface.

14. A method of selectively depositing silicon oxide on a metal surface of a substrate relative to a dielectric surface of the substrate comprising a deposition super-cycle comprising:

contacting the substrate with a silylating agent to selectively passivate the dielectric surface relative to the metal surface of the substrate, and conducting one or more silicon oxide deposition sub-cycles comprising alternately and sequentially: (i) contacting the substrate with a metal catalyst to selectively deposit the metal catalyst on the metal surface of the substrate relative to the dielectric surface of the substrate to thereby form a catalyzed metal surface, wherein the metal catalyst comprises dimethylaluminum isopropoxide (DMAI), and (ii) contacting the catalyzed metal surface with a silicon reactant to selectively deposit silicon oxide on the catalyzed metal surface relative to the dielectric surface.

15. The method of claim 14, wherein the step of contacting the substrate with the silylating agent to selectively passivate the dielectric surface relative to the metal surface of the substrate is at least 80% selective to the dielectric surface as compared to the metal surface.

16. The method of claim 14, wherein the silicon reactant comprises a silanol.

17. The method of claim 14, wherein the silicon reactant comprises tris(tert-butoxy) silanol (TBS), tris(isopropoxy) silanol (TIS), or tris(tert-pentoxy) silanol (TPS).

18. The method of claim 14, further comprising: after a final silicon oxide deposition sub-cycle, cleaning the substrate to remove passivating material from the dielectric surface.

19. The method of claim 18, wherein the cleaning includes treating the substrate with an $H_2$ plasma treatment.

* * * * *